(12) United States Patent
Rumler et al.

(10) Patent No.: US 10,735,976 B2
(45) Date of Patent: Aug. 4, 2020

(54) SYSTEMS AND METHODS FOR NETWORK DESIGN, MONITORING AND VISUALIZATION

(71) Applicant: Johnson Controls Technology Company, Auburn Hills, MI (US)

(72) Inventors: Daniel R. Rumler, New Berlin, WI (US); Nicholas J. Schaf, Hartland, WI (US); Kim K. Weller, Mukwonago, WI (US); Jeremy P. Hannon, Milwaukee, WI (US); Milan Mitra, Milwaukee, WI (US); Anchal K. Swarnkar, Shorewood, WI (US)

(73) Assignee: Johnson Controls Technology Company, Auburn Hills, MI (US)

( * ) Notice: Subject to any disclaimer, the term of this patent is extended or adjusted under 35 U.S.C. 154(b) by 135 days.

(21) Appl. No.: 15/968,566

(22) Filed: May 1, 2018

(65) Prior Publication Data
US 2018/0317095 A1 Nov. 1, 2018

Related U.S. Application Data

(60) Provisional application No. 62/492,800, filed on May 1, 2017.

(51) Int. Cl.
*H04W 16/20* (2009.01)
*H04W 24/10* (2009.01)
(Continued)

(52) U.S. Cl.
CPC .......... *H04W 16/20* (2013.01); *H04W 24/10* (2013.01); *G06F 30/00* (2020.01); *H04L 41/145* (2013.01);
(Continued)

(58) Field of Classification Search
CPC ..... H04W 16/20; H04W 24/10; H04W 16/00; H04W 16/26; H04W 84/18; H04L 41/147; H04L 41/22; H04L 41/145; G06F 17/50
See application file for complete search history.

(56) References Cited

U.S. PATENT DOCUMENTS 7,246,045 B1 * 7/2007 Rappaport .............. H04L 41/22
345/441
8,290,499 B2 * 10/2012 Rappaport ............ H04W 16/20
455/422.1

(Continued)

*Primary Examiner* — Brian T O Connor
(74) *Attorney, Agent, or Firm* — Foley & Lardner LLP

(57) ABSTRACT

A wireless mesh network survey tool is provided. The tool includes a user interface and a processing circuit. The processing circuit is configured to access a scaled floorplan of a building site, and identify a receiver device location on the scaled floorplan. The processing circuit is further configured to instruct a user to position a transmitter device at a number of test locations to determine a signal strength at each of the test locations. The processing circuit is also configured to determine a device count for a proposed mesh network based on the signal strength at each of the test locations. The device count includes a number of repeater devices. The processing circuit is further configured to display the proposed mesh network to the user via the user interface. The proposed mesh network includes recommended locations for the repeater devices on the scaled floorplan.

20 Claims, 24 Drawing Sheets

(51) Int. Cl.
*H04W 84/18* (2009.01)
*H04L 12/24* (2006.01)
*H04W 16/26* (2009.01)
*H04W 16/00* (2009.01)
*G06F 30/00* (2020.01)

(52) U.S. Cl.
CPC ............ *H04L 41/147* (2013.01); *H04L 41/22* (2013.01); *H04W 16/00* (2013.01); *H04W 16/26* (2013.01); *H04W 84/18* (2013.01)

(56) References Cited

U.S. PATENT DOCUMENTS

| | | | |
|---|---|---|---|
| 9,668,146 B2* | 5/2017 | Lau | H04W 16/20 |
| 10,129,095 B2* | 11/2018 | Kalika | H04N 21/4126 |
| 10,356,692 B2* | 7/2019 | Greenberger | H04W 64/003 |
| 2004/0236547 A1* | 11/2004 | Rappaport | G06F 17/509 |
| | | | 703/2 |
| 2014/0244817 A1* | 8/2014 | Pulleti | H04W 16/18 |
| | | | 709/223 |
| 2015/0312774 A1* | 10/2015 | Lau | H04W 16/20 |
| | | | 455/446 |
| 2017/0238192 A1* | 8/2017 | Lee | H04W 4/70 |
| | | | 455/500 |
| 2017/0343231 A1 | 11/2017 | Rumler et al. | |
| 2018/0027423 A1* | 1/2018 | Greenberger | H04W 64/003 |
| | | | 455/446 |
| 2018/0101803 A1* | 4/2018 | Tiwari | G06Q 10/04 |
| 2018/0102858 A1* | 4/2018 | Tiwari | G06Q 10/04 |
| 2018/0121571 A1* | 5/2018 | Tiwari | G06Q 10/10 |
| 2019/0387415 A1* | 12/2019 | Scahill | H04W 16/26 |
| 2020/0022217 A1* | 1/2020 | Ringland | H04W 4/80 |

* cited by examiner

```
Main Menu:
  1 = RECEIVE ONE-TO-ONE SENSOR (S)
  2 = MANY-TO-ONE SENSOR(S)
  3 = MONITOR ONE-TO-ONE SYSTEM
  4 = MONITOR MANY-TO-ONE SYSTEM
  5 = SET CLOCK
  6 = HELP ENTERING ONE-TO-ONE MONITOR MODE (PRESS ANY KEY TO RETURN TO MAIN MENU)
ATTEMPTING TO SYNC WITH RECEIVER, PLEASE WAIT (MAY TAKE UP TO 30 SEC).
SYNCHRONIZATION ACHIEVED.
15:55:58  Prop00  ID 257  Sn00001A  AssocGrnt  XCnt000  Freq11  SPwr32  Rpwr32  SgStr -23dB,E,100%  RFQual 105
15:56:25  Prop00  ID 257  Sn00001A  SenAcknvl  Tap +24.59C +076.27F  XCnt000  Freq20  SgStr -53dB,E,100%  RFQual 107
15:57:08  Prop00  ID 257  Sn00001B  AssocGrnt  XCnt000  Freq11  SPwr32  Rpwr32  SgStr -45dB,E,100%  RFQual 107
15:57:29  Prop00  ID 257  Sn00001A  SenAcknvl  Tap +24.49C +076.08F  XCnt001  Freq20  SPwr32  RPwr32  SgStr -53dB,E,100%  RFQual 107
15:57:30  Prop00  ID 257  Sn00001B  SenAcknvl  Tap +25.91C +078.63F  XCnt000  Freq20  SPwr32  RPwr32  SgStr -37dB,E,100%  RFQual 107
15:58:31  Prop00  ID 257  Sn00001A  SenAcknvl  Tap +24.42C +075.95F  XCnt002  Freq20  SPwr32  RPwr32  SgStr -56dB,E,100%  RFQual 107
15:58:32  Prop00  ID 257  Sn00001B  SenAcknvl  Tap +25.29C +077.52F  XCnt001  Freq20  SPwr32  RPwr32  SgStr -35dB,E,100%  RFQual 108
15:58:42  Prop00  ID 257  Sn00001A  SenAcknvl  Tap +25.29C +077.52F  XCnt002  Freq20  SPwr32  RPwr32  SgStr -31dB,E,100%  RFQual 107
15:58:43  Prop00  ID 257  Sn00001B  SenAcknvl  Tap +25.29C +077.52F  XCnt003  Freq20  SPwr32  RPwr32  SgStr -31dB,E,100%  RFQual 107
15:58:47  Prop00  ID 257  Sn00001A  SenAcknvl  Tap +25.26C +077.47F  XCnt004  Freq20  SPwr32  RPwr32  SgStr -31dB,E,100%  RFQual 106
15:59:31  Prop00  ID 257  Sn00001B  SenAcknvl  Tap +24.42C +075.95F  XCnt003  Freq20  SPwr32  RPwr32  SgStr -52dB,E,100%  RFQual 108
15:59:33  Prop00  ID 257  Sn00001B  SenAcknvl  Tap +25.12C +077.22F  XCnt005  Freq20  SPwr32  RPwr32  SgStr -35dB,E,100%  RFQual 108
```

```
// Create sniffer configuration object.
SnifferConfiguration config;
config.set_filter("port xxx");
config.set_promisc_mode(true);
config.set_snap_len(400);

// Construct a Sniffer object, using the configuration above.
Sniffer sniffer("eth0", config);
```

FIG. 19

SYSTEMS AND METHODS FOR NETWORK DESIGN, MONITORING AND VISUALIZATION

CROSS-REFERENCE TO RELATED PATENT APPLICATION

This application claims the benefit of and priority to U.S. Provisional Patent Application No. 62/492,800, filed May 1, 2017, the entire disclosure of which is incorporated by reference herein.

BACKGROUND

The present disclosure relates generally to building management systems. The present disclosure relates more particularly to systems and methods for extending a wireless mesh network of multiple wireless BMS devices to allow for wireless communication from various BMS monitoring devices to one or more BMS controllers.

A building management system (BMS) is, in general, a system of devices configured to control, monitor, and manage equipment in or around a building or building area. A BMS can include a heating, ventilation, and air conditioning (HVAC) system, a security system, a lighting system, a fire alerting system, another system that is capable of managing building functions or devices, or any combination thereof. BMS devices may be installed in any environment (e.g., an indoor area or an outdoor area) and the environment may include any number of buildings, spaces, zones, rooms, or areas. A BMS may include a variety of devices (e.g., HVAC devices, controllers, chillers, fans, sensors, etc.) configured to facilitate monitoring and controlling the building space. Throughout this disclosure, such devices are referred to as BMS devices or building equipment.

Currently, when designing and implementing a wireless mesh network, such as a Zigbee (IEEE 802.15.4) mesh network, there are no tools or services to help an installer or technician to decide potential test routes. For example, the technician might inadequately test a mesh network in the field, as they must rely on their own discretion and judgement when testing or designing the mesh network. This can be particularly difficult in larger networks. Further, many building or systems include multiple broadcasts in the 2.4 GHz (as well as other) spectrum. For example, Wi-Fi, Bluetooth, wireless AV devices, wireless headsets, and other devices all broadcast in the 2.4 GHz spectrum. While some tools, such as Chanalyzer or WiSpy are available, their costs can be prohibitive for use in all situations.

In many current systems, the technician may be required to draw out multiple radius circles on a scaled floor plan to determine the required location of wireless repeaters for use in the mesh network. For example, some systems may require wireless repeaters for every twenty-five foot radius for proper operation. However, the scaled diagrams used by the technician may not include other wireless devices, such as Wi-Fi access points (AP), which may cause adverse interference in the mesh network. Further, this visual analysis may not take into account certain barriers or other objects within the space which may result in a rapid decline in signal strength from a wireless repeater, thereby resulting in weak spots in the mesh network. Finally, there is generally no generated report which can list the quality and strengths of the signal across the network and the feasibility for a potential wireless installation on the site. Rather, the technician provides a qualitative analysis regarding the wireless health of the site.

Further, for an existing wireless mesh network it can be difficult to accurately diagnose issues within the mesh network using existing tools. For example, network data is needed at the time when one or more devices within the mesh network toggle between an online or offline condition, or show some sort of unexpected behavior. Further, as more wireless devices are implemented at the site, the air space, particularly in the 2.4 GHz spectrum, may become saturated, resulting in a loss in communication within the mesh network over a period of time. Often, a technician will need to be dispatched to the site to determine the issues, resulting in additional costs for the site. Further, the data may not be graphically represented, requiring a trained technician to accurately analyze the status of the mesh network. Furthermore, current tools do not allow for the network traffic on the wireless mesh network to be accurately monitored, adding additional complexity when trying to accurately diagnose issues within the wireless mesh network.

SUMMARY

One implementation of the present disclosure is a wireless mesh network survey tool. The tool includes a user interface and a processing circuit. The processing circuit is configured to access a scaled floorplan of a building site, and identify a receiver device location on the scaled floorplan. The processing circuit is further configured to instruct a user to position a transmitter device that is communicably coupled to the receiver device at a number of test locations to determine a signal strength at each of the test locations. The processing circuit is also configured to determine a device count for a proposed mesh network based on the signal strength at each of the test locations. The device count includes a number of repeater devices. The processing circuit is further configured to display the proposed mesh network to the user via the user interface. The proposed mesh network includes recommended locations for the repeater devices on the scaled floorplan.

In some embodiments, the processing circuit further includes a data analysis module configured to generate the recommended locations for the repeater devices. In other embodiments, the recommended locations for the repeater devices are based on building materials, ceiling materials, or wall materials. In other embodiments, the data analysis module is further configured to generate a technical survey report for the building site. The technical survey report includes a heat map or a weak zone.

In some embodiments, the proposed wireless mesh network is a Zigbee (IEEE 802.15.4) mesh network.

In some embodiments, the proposed wireless mesh network is a Wi-Fi mesh network.

In some embodiments, the user interface includes a switch, an actuator, a touch screen display, or a keypad.

In some embodiments, the wireless mesh network survey tool includes at least one of a laptop computer, a personal computer (PC), a tablet computer, or a mobile device.

Another implementation of the present disclosure is a method of generating a proposed wireless mesh network for a building. The method includes accessing a scaled floorplan of a building site, identifying a receiver device location on the scaled floorplan, and instructing the user to position a transmitter device that is communicably coupled to the receiver device at a number of test locations to determine a signal strength at each of the test locations. The method further includes determining a device count for a proposed wireless mesh network. The device count includes a number of repeater devices. The method further includes displaying the proposed wireless mesh network to the user via the user interface. The proposed wireless mesh network includes recommended locations for the number of repeater devices on the scaled floorplan.

In some embodiments, the method further includes generating a technical survey report for the building site. The technical survey report includes at least one of a heat map or a weak zone.

In some embodiments, the proposed wireless mesh network is a Zigbee (IEEE 802.15.4) mesh network.

In some embodiments, the proposed wireless mesh network is a Wi-Fi mesh network.

Yet another implementation of the present disclosure is a wireless mesh network diagnostic tool. The wireless mesh network diagnostic tool includes a user interface and a processing circuit including a visualization tool. The visualization tool is configured to access static data regarding a building site. The static data is determined at least in part by a network survey process that includes user positioning of a transmitter device at a number of test locations. The visualization tool is further configured to gather diagnostic data from a number of wireless network mesh devices, and display a diagnostic map to a user via the user interface. The diagnostic map includes at least one diagnostic indicator.

In some embodiments, the static data includes a scaled floorplan and locations of the number of wireless network mesh devices.

In some embodiments, the diagnostic indicator is a device health indicator including a color-coded ring surrounding one of the of wireless network mesh devices.

In some embodiments, the diagnostic indicator is a wireless link quality indicator including a color-coded arc connecting a first wireless network mesh device to a second wireless network mesh device.

In some embodiments, the visualization tool is configured to gather diagnostic data from the number of wireless network mesh devices using a quick scan function. In other embodiments, the quick scan function is configured to gather a device status or a device health from each of the number of wireless network mesh devices.

In some embodiments, the visualization tool is configured to gather diagnostic data from the number of wireless network mesh devices using an extensive scan function. In other embodiments, the extensive scan function is configured to gather diagnostic data from the number of wireless network mesh devices over a configurable time period.

Those skilled in the art will appreciate that the summary is illustrative only and is not intended to be in any way limiting. Other aspects, inventive features, and advantages of the devices and/or processes described herein, as defined solely by the claims, will become apparent in the detailed description set forth herein and taken in conjunction with the accompanying drawings.

BRIEF DESCRIPTION OF THE DRAWINGS

FIG. 6 is an example data set of a wireless mesh network, according to some embodiments.

FIG. 19 is a code snippet of a sniffing function, according to some embodiments.

DETAILED DESCRIPTION

Referring generally to the FIGURES, systems and methods for extending wireless mesh networks are shown, according to various exemplary embodiments. The systems and methods described herein may be used to improve wireless communication capabilities within a building management system (BMS). By providing allowing for wireless communication between mesh subnetworks and a BMS controller, installation and configuration can be simplified.

Building Management System and HVAC System

Figure 1:
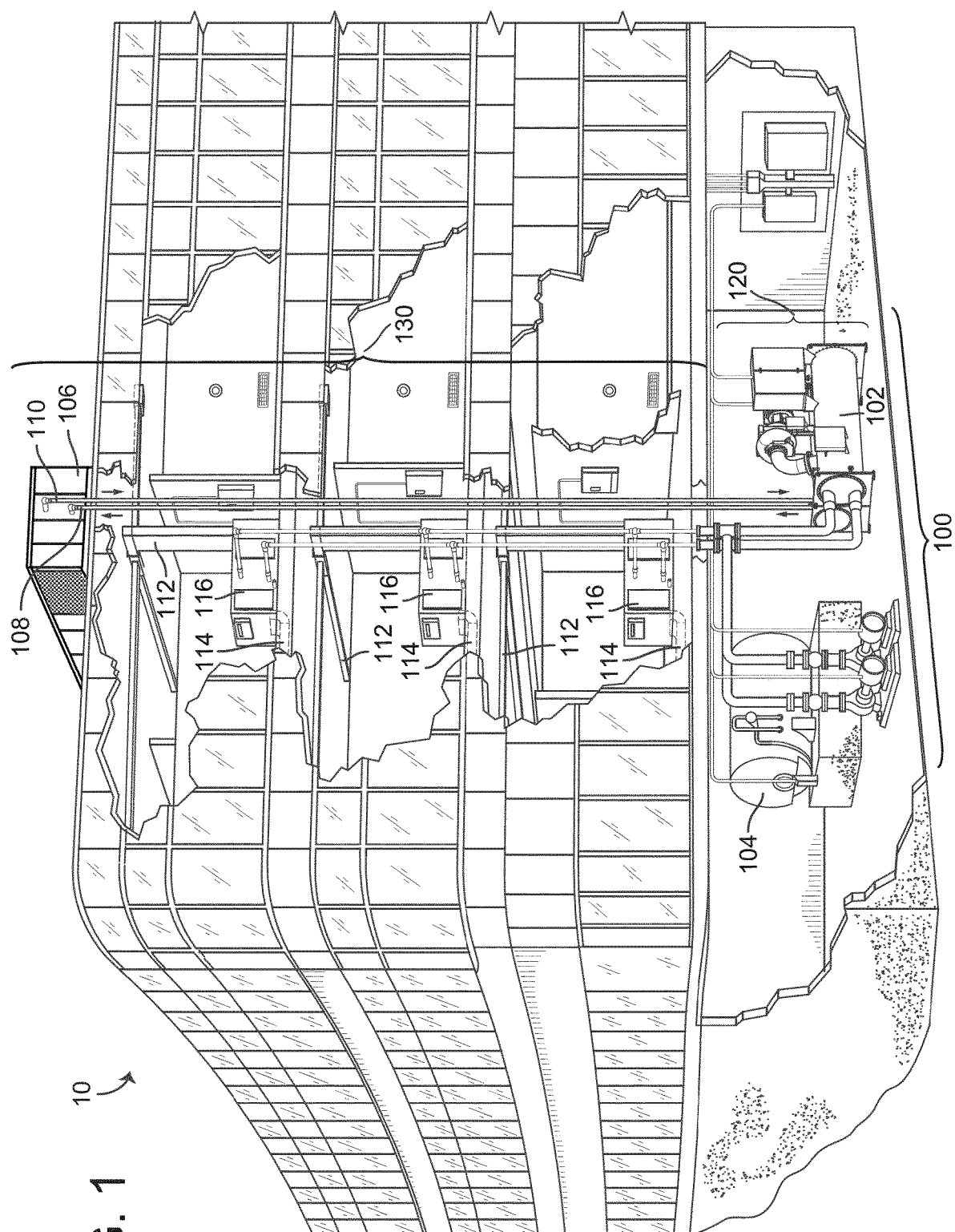
FIG. 1 is a drawing of a building equipped with a HVAC system, according some embodiments.

Referring now to FIGS. 1-4, an exemplary building management system (BMS) and HVAC system in which the systems and methods of the present disclosure may be implemented are shown, according to one embodiment. Referring particularly to FIG. 1, a perspective view of a building 10 is shown. Building 10 is served by a BMS. A BMS is, in general, a system of devices configured to control, monitor, and manage equipment in or around a building or building area. A BMS can include, for example, an HVAC system, a security system, a lighting system, a fire alerting system, or any other system that is capable of managing building functions or devices, or any combination thereof.

The BMS that serves building 10 includes an HVAC system 100. HVAC system 100 may include a plurality of HVAC devices (e.g., heaters, chillers, air handling units, pumps, fans, thermal energy storage, etc.) configured to provide heating, cooling, ventilation, or other services for building 10. For example, HVAC system 100 is shown to include a waterside system 120 and an airside system 130. Waterside system 120 may provide a heated or chilled fluid to an air handling unit of airside system 130. Airside system 130 may use the heated or chilled fluid to heat or cool an airflow provided to building 10. An exemplary waterside system and airside system which may be used in HVAC system 100 are described in greater detail with reference to FIGS. 2-3.

HVAC system 100 is shown to include a chiller 102, a boiler 104, and a rooftop air handling unit (AHU) 106. Waterside system 120 may use boiler 104 and chiller 102 to heat or cool a working fluid (e.g., water, glycol, etc.) and may circulate the working fluid to AHU 106. In various embodiments, the HVAC devices of waterside system 120 may be located in or around building 10 (as shown in FIG. 1) or at an offsite location such as a central plant (e.g., a chiller plant, a steam plant, a heat plant, etc.). The working fluid may be heated in boiler 104 or cooled in chiller 102, depending on whether heating or cooling is required in building 10. Boiler 104 may add heat to the circulated fluid, for example, by burning a combustible material (e.g., natural gas) or using an electric heating element. Chiller 102 may place the circulated fluid in a heat exchange relationship with another fluid (e.g., a refrigerant) in a heat exchanger (e.g., an evaporator) to absorb heat from the circulated fluid. The working fluid from chiller 102 and/or boiler 104 may be transported to AHU 106 via piping 108.

AHU 106 may place the working fluid in a heat exchange relationship with an airflow passing through AHU 106 (e.g., via one or more stages of cooling coils and/or heating coils). The airflow may be, for example, outside air, return air from within building 10, or a combination of both. AHU 106 may transfer heat between the airflow and the working fluid to provide heating or cooling for the airflow. For example, AHU 106 may include one or more fans or blowers configured to pass the airflow over or through a heat exchanger containing the working fluid. The working fluid may then return to chiller 102 or boiler 104 via piping 110.

Airside system 130 may deliver the airflow supplied by AHU 106 (i.e., the supply airflow) to building 10 via air supply ducts 112 and may provide return air from building 10 to AHU 106 via air return ducts 114. In some embodiments, airside system 130 includes multiple variable air volume (VAV) units 116. For example, airside system 130 is shown to include a separate VAV unit 116 on each floor or zone of building 10. VAV units 116 may include dampers or other flow control elements that can be operated to control an amount of the supply airflow provided to individual zones of building 10. In other embodiments, airside system 130 delivers the supply airflow into one or more zones of building 10 (e.g., via supply ducts 112) without using intermediate VAV units 116 or other flow control elements. AHU 106 may include various sensors (e.g., temperature sensors, pressure sensors, etc.) configured to measure attributes of the supply airflow. AHU 106 may receive input from sensors located within AHU 106 and/or within the building zone and may adjust the flow rate, temperature, or other attributes of the supply airflow through AHU 106 to achieve setpoint conditions for the building zone.

Figure 2:
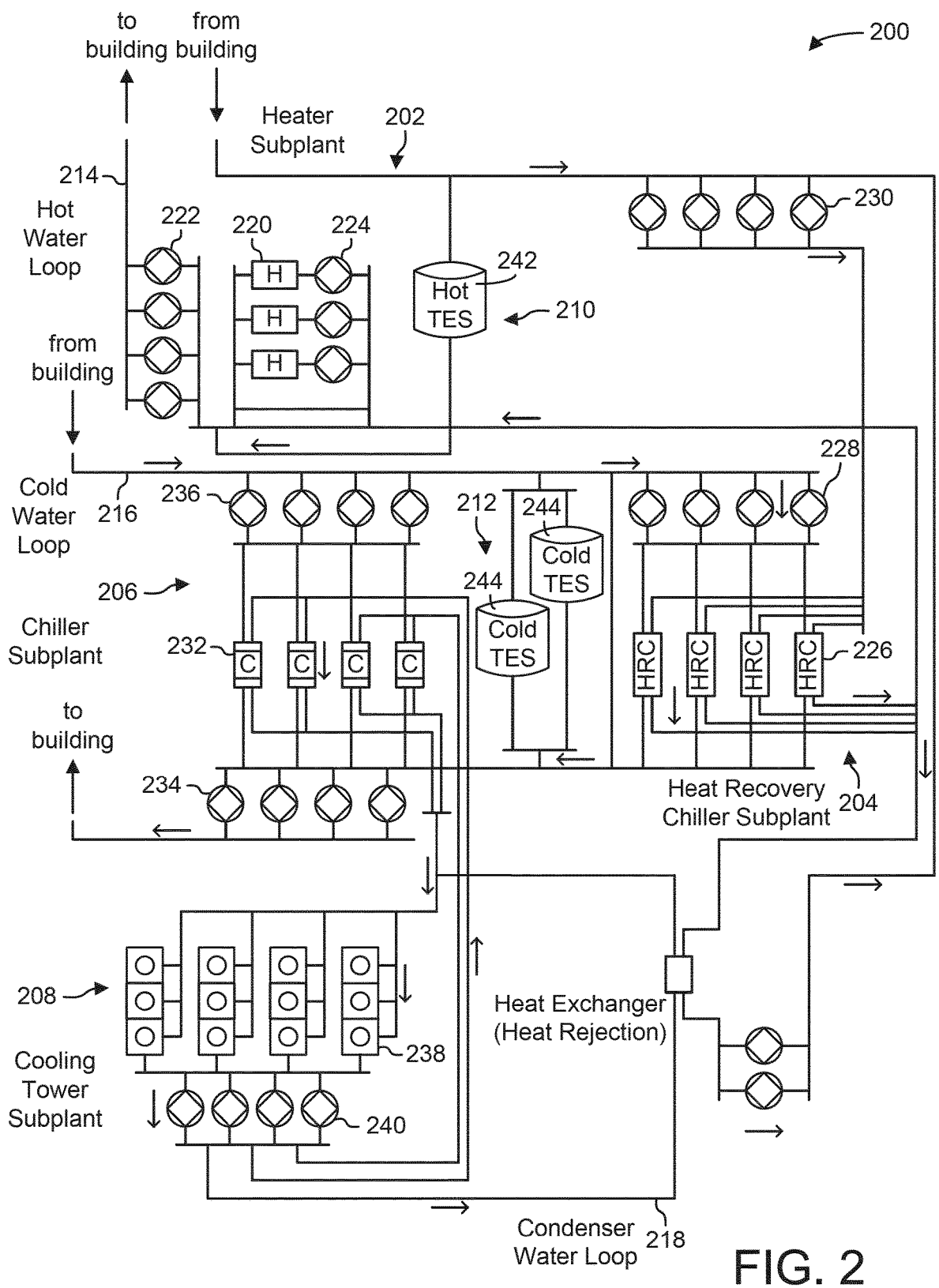
FIG. 2 is a block diagram of a waterside system that may be used in conjunction with the building of FIG. 1, according to some embodiments.

Referring now to FIG. 2, a block diagram of a waterside system 200 is shown, according to one embodiment. In various embodiments, waterside system 200 may supplement or replace waterside system 120 in HVAC system 100 or may be implemented separate from HVAC system 100. When implemented in HVAC system 100, waterside system 200 may include a subset of the HVAC devices in HVAC system 100 (e.g., boiler 104, chiller 102, pumps, valves, etc.) and may operate to supply a heated or chilled fluid to AHU 106. The HVAC devices of waterside system 200 may be located within building 10 (e.g., as components of waterside system 120) or at an offsite location such as a central plant.

In FIG. 2, waterside system 200 is shown as a central plant having a plurality of subplants 202-212. Subplants 202-212 are shown to include a heater subplant 202, a heat recovery chiller subplant 204, a chiller subplant 206, a cooling tower subplant 208, a hot thermal energy storage (TES) subplant 210, and a cold thermal energy storage (TES) subplant 212. Subplants 202-212 consume resources (e.g., water, natural gas, electricity, etc.) from utilities to serve the thermal energy loads (e.g., hot water, cold water, heating, cooling, etc.) of a building or campus. For example, heater subplant 202 may be configured to heat water in a hot water loop 214 that circulates the hot water between heater subplant 202 and building 10. Chiller subplant 206 may be configured to chill water in a cold water loop 216 that circulates the cold water between the chiller subplant 206 and the building 10. Heat recovery chiller subplant 204 may be configured to transfer heat from cold water loop 216 to hot water loop 214 to provide additional heating for the hot water and additional cooling for the cold water. Condenser water loop 218 may absorb heat from the cold water in chiller subplant 206 and reject the absorbed heat in cooling tower subplant 208 or transfer the absorbed heat to hot water loop 214. Hot TES subplant 210 and cold TES subplant 212 may store hot and cold thermal energy, respectively, for subsequent use.

Hot water loop 214 and cold water loop 216 may deliver the heated and/or chilled water to air handlers located on the rooftop of building 10 (e.g., AHU 106) or to individual floors or zones of building 10 (e.g., VAV units 116). The air handlers push air past heat exchangers (e.g., heating coils or cooling coils) through which the water flows to provide heating or cooling for the air. The heated or cooled air may be delivered to individual zones of building 10 to serve the thermal energy loads of building 10. The water then returns to subplants 202-212 to receive further heating or cooling.

Although subplants 202-212 are shown and described as heating and cooling water for circulation to a building, it is understood that any other type of working fluid (e.g., glycol, CO2, etc.) may be used in place of or in addition to water to serve the thermal energy loads. In other embodiments, subplants 202-212 may provide heating and/or cooling directly to the building or campus without requiring an intermediate heat transfer fluid. These and other variations to waterside system 200 are within the teachings of the present disclosure.

Each of subplants 202-212 may include a variety of equipment configured to facilitate the functions of the subplant. For example, heater subplant 202 is shown to include a plurality of heating elements 220 (e.g., boilers, electric heaters, etc.) configured to add heat to the hot water in hot water loop 214. Heater subplant 202 is also shown to include several pumps 222 and 224 configured to circulate the hot water in hot water loop 214 and to control the flow rate of the hot water through individual heating elements 220. Chiller subplant 206 is shown to include a plurality of chillers 232 configured to remove heat from the cold water in cold water loop 216. Chiller subplant 206 is also shown to include several pumps 234 and 236 configured to circulate the cold water in cold water loop 216 and to control the flow rate of the cold water through individual chillers 232.

Heat recovery chiller subplant 204 is shown to include a plurality of heat recovery heat exchangers 226 (e.g., refrigeration circuits) configured to transfer heat from cold water loop 216 to hot water loop 214. Heat recovery chiller subplant 204 is also shown to include several pumps 228 and 230 configured to circulate the hot water and/or cold water through heat recovery heat exchangers 226 and to control the flow rate of the water through individual heat recovery heat exchangers 226. Cooling tower subplant 208 is shown to include a plurality of cooling towers 238 configured to remove heat from the condenser water in condenser water loop 218. Cooling tower subplant 208 is also shown to include several pumps 240 configured to circulate the condenser water in condenser water loop 218 and to control the flow rate of the condenser water through individual cooling towers 238.

Hot TES subplant 210 is shown to include a hot TES tank 242 configured to store the hot water for later use. Hot TES subplant 210 may also include one or more pumps or valves configured to control the flow rate of the hot water into or out of hot TES tank 242. Cold TES subplant 212 is shown to include cold TES tanks 244 configured to store the cold water for later use. Cold TES subplant 212 may also include one or more pumps or valves configured to control the flow rate of the cold water into or out of cold TES tanks 244.

In some embodiments, one or more of the pumps in waterside system 200 (e.g., pumps 222, 224, 228, 230, 234, 236, and/or 240) or pipelines in waterside system 200 include an isolation valve associated therewith. Isolation valves may be integrated with the pumps or positioned upstream or downstream of the pumps to control the fluid flows in waterside system 200. In various embodiments, waterside system 200 may include more, fewer, or different types of devices and/or subplants based on the particular configuration of waterside system 200 and the types of loads served by waterside system 200.

Figure 3:
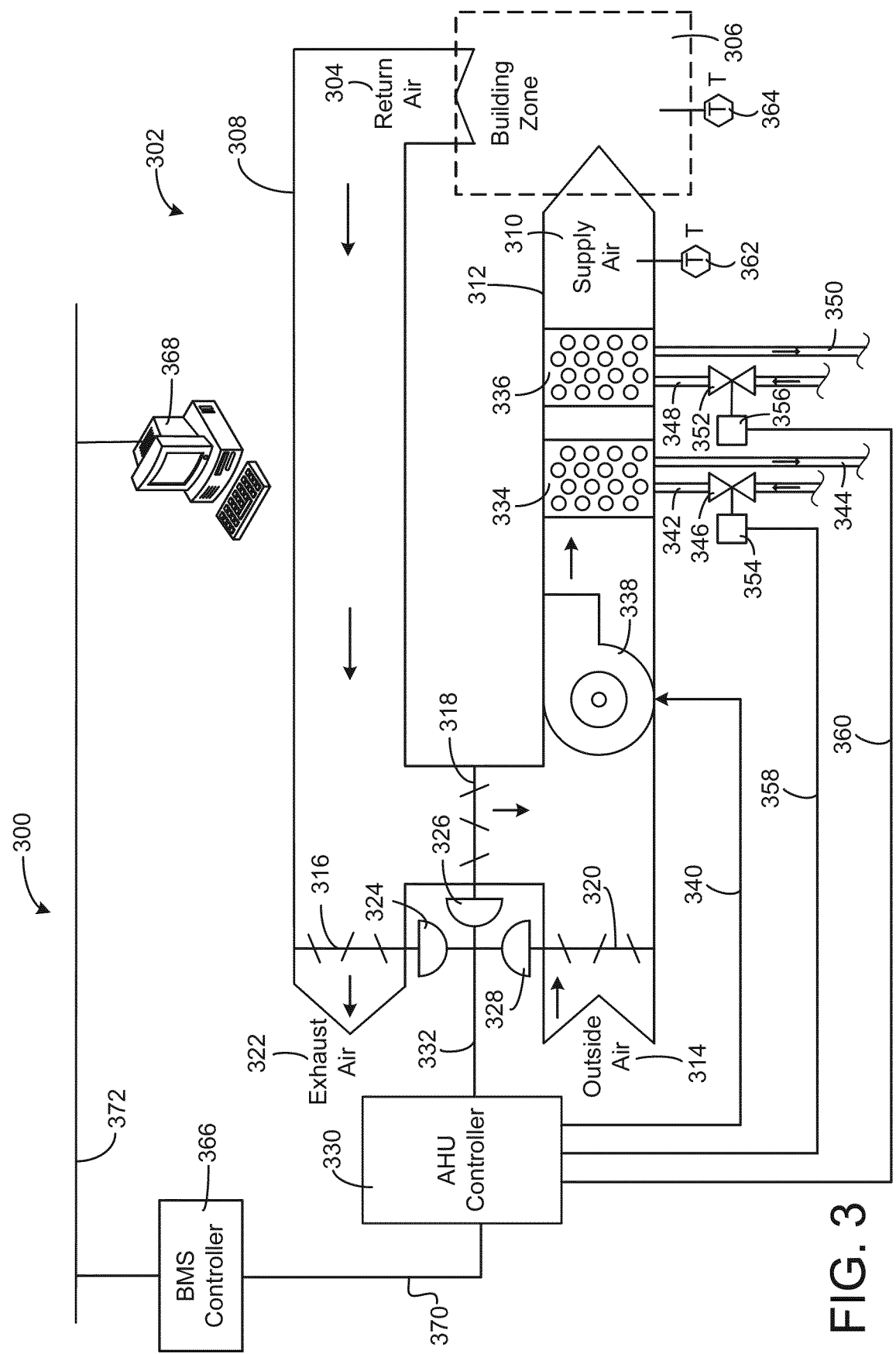
FIG. 3 is a block diagram of an airside system that may be used in conjunction with the building of FIG. 1, according to some embodiments.

Referring now to FIG. 3, a block diagram of an airside system 300 is shown, according to an exemplary embodiment. In various embodiments, airside system 300 may supplement or replace airside system 130 in HVAC system 100 or may be implemented separate from HVAC system 100. When implemented in HVAC system 100, airside system 300 may include a subset of the HVAC devices in HVAC system 100 (e.g., AHU 106, VAV units 116, ducts 112-114, fans, dampers, etc.) and may be located in or around building 10. Airside system 300 may operate to heat or cool an airflow provided to building 10 using a heated or chilled fluid provided by waterside system 200.

In FIG. 3, airside system 300 is shown to include an economizer-type air handling unit (AHU) 302. Economizer-type AHUs vary the amount of outside air and return air used by the air handling unit for heating or cooling. For example, AHU 302 may receive return air 304 from building zone 306 via return air duct 308 and may deliver supply air 310 to building zone 306 via supply air duct 312. In some embodiments, AHU 302 is a rooftop unit located on the roof of building 10 (e.g., AHU 106 as shown in FIG. 1) or otherwise positioned to receive both return air 304 and outside air 314. AHU 302 may be configured to operate exhaust air damper 316, mixing damper 318, and outside air damper 320 to control an amount of outside air 314 and return air 304 that combine to form supply air 310. Any return air 304 that does not pass through mixing damper 318 may be exhausted from AHU 302 through exhaust damper 316 as exhaust air 322.

Each of dampers 316-320 may be operated by an actuator. For example, exhaust air damper 316 may be operated by actuator 324, mixing damper 318 may be operated by actuator 326, and outside air damper 320 may be operated by actuator 328. Actuators 324-328 may communicate with an AHU controller 330 via a communications link 332. Actuators 324-328 may receive control signals from AHU controller 330 and may provide feedback signals to AHU controller 330. Feedback signals may include, for example, an indication of a current actuator or damper position, an amount of torque or force exerted by the actuator, diagnostic information (e.g., results of diagnostic tests performed by actuators 324-328), status information, commissioning information, configuration settings, calibration data, and/or other types of information or data that may be collected, stored, or used by actuators 324-328. AHU controller 330 may be an economizer controller configured to use one or more control algorithms (e.g., state-based algorithms, extremum seeking control (ESC) algorithms, proportional-integral (PI) control algorithms, proportional-integral-derivative (PID) control algorithms, model predictive control (MPC) algorithms, feedback control algorithms, etc.) to control actuators 324-328.

Still referring to FIG. 3, AHU 302 is shown to include a cooling coil 334, a heating coil 336, and a fan 338 positioned within supply air duct 312. Fan 338 may be configured to force supply air 310 through cooling coil 334 and/or heating coil 336 and provide supply air 310 to building zone 306. AHU controller 330 may communicate with fan 338 via communications link 340 to control a flow rate of supply air 310. In some embodiments, AHU controller 330 controls an amount of heating or cooling applied to supply air 310 by modulating a speed of fan 338.

Cooling coil 334 may receive a chilled fluid from waterside system 200 (e.g., from cold water loop 216) via piping 342 and may return the chilled fluid to waterside system 200 via piping 344. Valve 346 may be positioned along piping 342 or piping 344 to control a flow rate of the chilled fluid through cooling coil 334. In some embodiments, cooling coil 334 includes multiple stages of cooling coils that can be independently activated and deactivated (e.g., by AHU controller 330, by BMS controller 366, etc.) to modulate an amount of cooling applied to supply air 310.

Heating coil 336 may receive a heated fluid from waterside system 200 (e.g., from hot water loop 214) via piping 348 and may return the heated fluid to waterside system 200 via piping 350. Valve 352 may be positioned along piping 348 or piping 350 to control a flow rate of the heated fluid through heating coil 336. In some embodiments, heating coil 336 includes multiple stages of heating coils that can be independently activated and deactivated (e.g., by AHU controller 330, by BMS controller 366, etc.) to modulate an amount of heating applied to supply air 310.

Each of valves 346 and 352 may be controlled by an actuator. For example, valve 346 may be controlled by actuator 354 and valve 352 may be controlled by actuator 356. Actuators 354-356 may communicate with AHU controller 330 via communications links 358-360. Actuators 354-356 may receive control signals from AHU controller 330 and may provide feedback signals to controller 330. In some embodiments, AHU controller 330 receives a measurement of the supply air temperature from a temperature sensor 362 positioned in supply air duct 312 (e.g., downstream of cooling coil 334 and/or heating coil 336). AHU controller 330 may also receive a measurement of the temperature of building zone 306 from a temperature sensor 364 located in building zone 306.

In some embodiments, AHU controller 330 operates valves 346 and 352 via actuators 354-356 to modulate an amount of heating or cooling provided to supply air 310 (e.g., to achieve a setpoint temperature for supply air 310 or to maintain the temperature of supply air 310 within a setpoint temperature range). The positions of valves 346 and 352 affect the amount of heating or cooling provided to supply air 310 by cooling coil 334 or heating coil 336 and may correlate with the amount of energy consumed to achieve a desired supply air temperature. AHU 330 may control the temperature of supply air 310 and/or building zone 306 by activating or deactivating coils 334-336, adjusting a speed of fan 338, or a combination of both.

Still referring to FIG. 3, airside system 300 is shown to include a building management system (BMS) controller 366 and a client device 368. BMS controller 366 may include one or more computer systems (e.g., servers, supervisory controllers, subsystem controllers, etc.) that serve as system level controllers, application or data servers, head nodes, or master controllers for airside system 300, waterside system 200, HVAC system 100, and/or other controllable systems that serve building 10. BMS controller 366 may communicate with multiple downstream building systems or subsystems (e.g., HVAC system 100, a security system, a lighting system, waterside system 200, etc.) via a communications link 370 according to like or disparate protocols (e.g., LON, BACnet, etc.). In various embodiments, AHU controller 330 and BMS controller 366 may be separate (as shown in FIG. 3) or integrated. In an integrated implementation, AHU controller 330 may be a software module configured for execution by a processor of BMS controller 366.

In some embodiments, AHU controller 330 receives information from BMS controller 366 (e.g., commands, setpoints, operating boundaries, etc.) and provides information to BMS controller 366 (e.g., temperature measurements, valve or actuator positions, operating statuses, diagnostics, etc.). For example, AHU controller 330 may provide BMS controller 366 with temperature measurements from temperature sensors 362-364, equipment on/off states, equipment operating capacities, and/or any other information that can be used by BMS controller 366 to monitor or control a variable state or condition within building zone 306.

Client device 368 may include one or more human-machine interfaces or client interfaces (e.g., graphical user interfaces, reporting interfaces, text-based computer interfaces, client-facing web services, web servers that provide pages to web clients, etc.) for controlling, viewing, or otherwise interacting with HVAC system 100, its subsystems, and/or devices. Client device 368 may be a computer workstation, a client terminal, a remote or local interface, or any other type of user interface device. Client device 368 may be a stationary terminal or a mobile device. For example, client device 368 may be a desktop computer, a computer server with a user interface, a laptop computer, a tablet, a smartphone, a PDA, or any other type of mobile or non-mobile device. Client device 368 may communicate with BMS controller 366 and/or AHU controller 330 via communications link 372.

Figure 4:
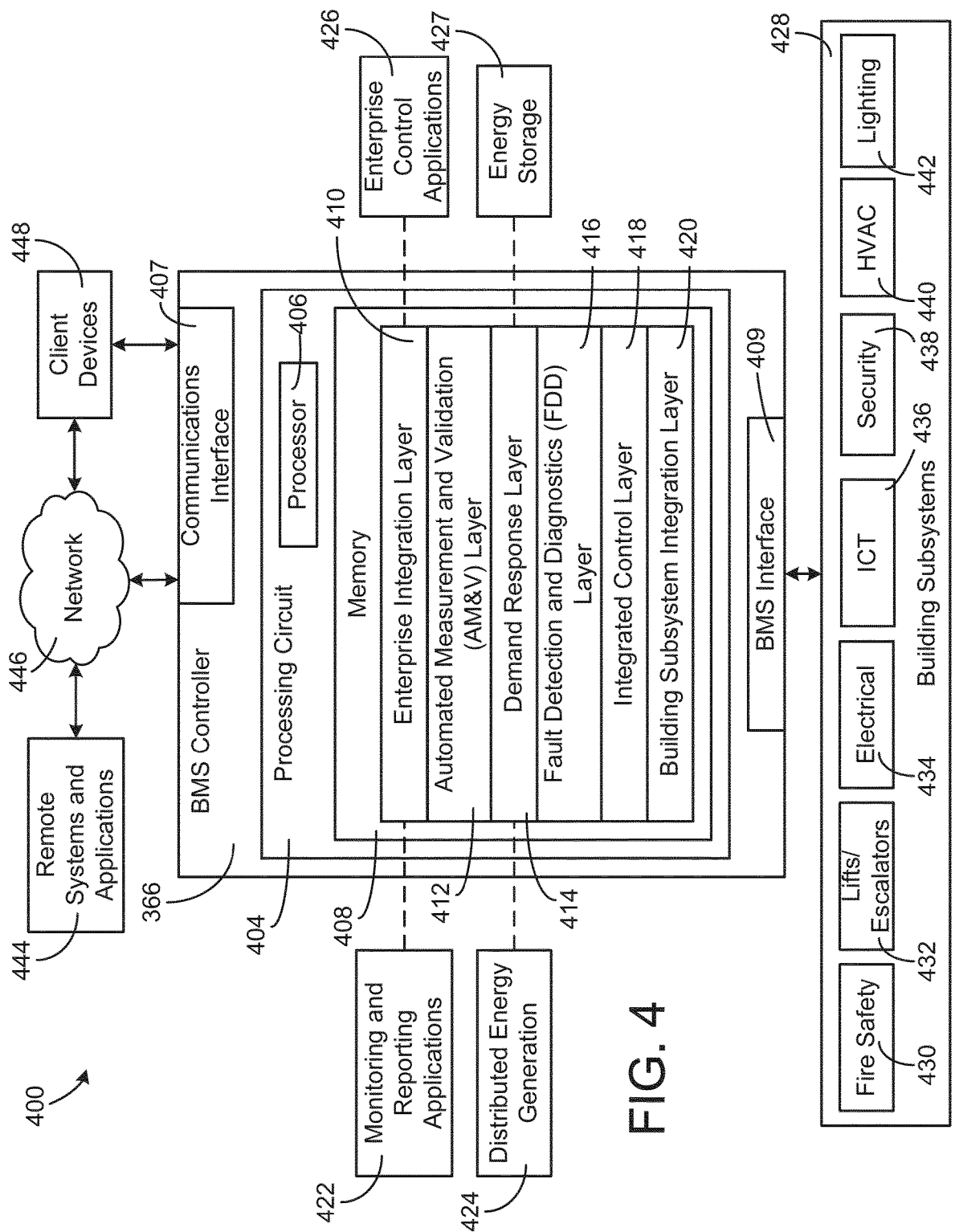
FIG. 4 is a block diagram of a building management system (BMS) that may be used to monitor and/or control the building of FIG. 1, according to some embodiments.

Referring now to FIG. 4, a block diagram of a building management system (BMS) 400 is shown, according to an exemplary embodiment. BMS 400 may be implemented in building 10 to automatically monitor and control various building functions. BMS 400 is shown to include BMS controller 366 and a plurality of building subsystems 428. Building subsystems 428 are shown to include a building electrical subsystem 434, an information communication technology (ICT) subsystem 436, a security subsystem 438, a HVAC subsystem 440, a lighting subsystem 442, a lift/escalators subsystem 432, and a fire safety subsystem 430. In various embodiments, building subsystems 428 can include fewer, additional, or alternative subsystems. For example, building subsystems 428 may also or alternatively include a refrigeration subsystem, an advertising or signage subsystem, a cooking subsystem, a vending subsystem, a printer or copy service subsystem, or any other type of building subsystem that uses controllable equipment and/or sensors to monitor or control building 10. In some embodiments, building subsystems 428 include waterside system 200 and/or airside system 300, as described with reference to FIGS. 2-3.

Each of building subsystems 428 may include any number of devices, controllers, and connections for completing its individual functions and control activities. HVAC subsystem 440 may include many of the same components as HVAC system 100, as described with reference to FIGS. 1-3. For example, HVAC subsystem 440 may include a chiller, a boiler, any number of air handling units, economizers, field controllers, supervisory controllers, actuators, temperature sensors, and other devices for controlling the temperature, humidity, airflow, or other variable conditions within building 10. Lighting subsystem 442 may include any number of light fixtures, ballasts, lighting sensors, dimmers, or other devices configured to controllably adjust the amount of light provided to a building space. Security subsystem 438 may include occupancy sensors, video surveillance cameras, digital video recorders, video processing servers, intrusion detection devices, access control devices and servers, or other security-related devices.

Still referring to FIG. 4, BMS controller 366 is shown to include a communications interface 407 and a BMS interface 409. Interface 407 may facilitate communications between BMS controller 366 and external applications (e.g., monitoring and reporting applications 422, enterprise control applications 426, remote systems and applications 444, applications residing on client devices 448, etc.) for allowing user control, monitoring, and adjustment to BMS controller 366 and/or subsystems 428. Interface 407 may also facilitate communications between BMS controller 366 and client devices 448. BMS interface 409 may facilitate communications between BMS controller 366 and building subsystems 428 (e.g., HVAC, lighting security, lifts, power distribution, business, etc.).

Interfaces 407, 409 can be or include wired or wireless communications interfaces (e.g., jacks, antennas, transmitters, receivers, transceivers, wire terminals, etc.) for conducting data communications with building subsystems 428 or other external systems or devices. In various embodiments, communications via interfaces 407, 409 may be direct (e.g., local wired or wireless communications) or via a communications network 446 (e.g., a WAN, the Internet, a cellular network, etc.). For example, interfaces 407, 409 can include an Ethernet card and port for sending and receiving data via an Ethernet-based communications link or network. In another example, interfaces 407, 409 can include a WiFi transceiver for communicating via a wireless communications network. In another example, one or both of interfaces 407, 409 may include cellular or mobile phone communications transceivers. In one embodiment, communications interface 407 is a power line communications interface and BMS interface 409 is an Ethernet interface. In other embodiments, both communications interface 407 and BMS interface 409 are Ethernet interfaces or are the same Ethernet interface.

Still referring to FIG. 4, BMS controller 366 is shown to include a processing circuit 404 including a processor 406 and memory 408. Processing circuit 404 may be communicably connected to BMS interface 409 and/or communications interface 407 such that processing circuit 404 and the various components thereof can send and receive data via interfaces 407, 409. Processor 406 can be implemented as a general purpose processor, an application specific integrated circuit (ASIC), one or more field programmable gate arrays (FPGAs), a group of processing components, or other suitable electronic processing components.

Memory 408 (e.g., memory, memory unit, storage device, etc.) may include one or more devices (e.g., RAM, ROM, Flash memory, hard disk storage, etc.) for storing data and/or computer code for completing or facilitating the various processes, layers and modules described in the present application. Memory 408 may be or include volatile memory or non-volatile memory. Memory 408 may include database components, object code components, script components, or any other type of information structure for supporting the various activities and information structures described in the present application. According to an exemplary embodiment, memory 408 is communicably connected to processor 406 via processing circuit 404 and includes computer code for executing (e.g., by processing circuit 404 and/or processor 406) one or more processes described herein.

In some embodiments, BMS controller 366 is implemented within a single computer (e.g., one server, one housing, etc.). In various other embodiments BMS controller 366 may be distributed across multiple servers or computers (e.g., that can exist in distributed locations). Further, while FIG. 4 shows applications 422 and 426 as existing outside of BMS controller 366, in some embodiments, applications 422 and 426 may be hosted within BMS controller 366 (e.g., within memory 408).

Still referring to FIG. 4, memory 408 is shown to include an enterprise integration layer 410, an automated measurement and validation (AM&V) layer 412, a demand response (DR) layer 414, a fault detection and diagnostics (FDD) layer 416, an integrated control layer 418, and a building subsystem integration later 420. Layers 410-420 may be configured to receive inputs from building subsystems 428 and other data sources, determine optimal control actions for building subsystems 428 based on the inputs, generate control signals based on the optimal control actions, and provide the generated control signals to building subsystems 428. The following paragraphs describe some of the general functions performed by each of layers 410-420 in BMS 400.

Enterprise integration layer 410 may be configured to serve clients or local applications with information and services to support a variety of enterprise-level applications. For example, enterprise control applications 426 may be configured to provide subsystem-spanning control to a graphical user interface (GUI) or to any number of enterprise-level business applications (e.g., accounting systems, user identification systems, etc.). Enterprise control applications 426 may also or alternatively be configured to provide configuration GUIs for configuring BMS controller 366. In yet other embodiments, enterprise control applications 426 can work with layers 410-420 to optimize building performance (e.g., efficiency, energy use, comfort, or safety) based on inputs received at interface 407 and/or BMS interface 409.

Building subsystem integration layer 420 may be configured to manage communications between BMS controller 366 and building subsystems 428. For example, building subsystem integration layer 420 may receive sensor data and input signals from building subsystems 428 and provide output data and control signals to building subsystems 428. Building subsystem integration layer 420 may also be configured to manage communications between building subsystems 428. Building subsystem integration layer 420 translate communications (e.g., sensor data, input signals, output signals, etc.) across a plurality of multi-vendor/multi-protocol systems.

Demand response layer 414 may be configured to optimize resource usage (e.g., electricity use, natural gas use, water use, etc.) and/or the monetary cost of such resource usage in response to satisfy the demand of building 10. The optimization may be based on time-of-use prices, curtailment signals, energy availability, or other data received from utility providers, distributed energy generation systems 424, from energy storage 427 (e.g., hot TES 242, cold TES 244, etc.), or from other sources. Demand response layer 414 may receive inputs from other layers of BMS controller 366 (e.g., building subsystem integration layer 420, integrated control layer 418, etc.). The inputs received from other layers may include environmental or sensor inputs such as temperature, carbon dioxide levels, relative humidity levels, air quality sensor outputs, occupancy sensor outputs, room schedules, and the like. The inputs may also include inputs such as electrical use (e.g., expressed in kWh), thermal load measurements, pricing information, projected pricing, smoothed pricing, curtailment signals from utilities, and the like.

According to an exemplary embodiment, demand response layer 414 includes control logic for responding to the data and signals it receives. These responses can include communicating with the control algorithms in integrated control layer 418, changing control strategies, changing setpoints, or activating/deactivating building equipment or subsystems in a controlled manner. Demand response layer 414 may also include control logic configured to determine when to utilize stored energy. For example, demand response layer 414 may determine to begin using energy from energy storage 427 just prior to the beginning of a peak use hour.

In some embodiments, demand response layer 414 includes a control module configured to actively initiate control actions (e.g., automatically changing setpoints) which minimize energy costs based on one or more inputs representative of or based on demand (e.g., price, a curtailment signal, a demand level, etc.). In some embodiments, demand response layer 414 uses equipment models to determine an optimal set of control actions. The equipment models may include, for example, thermodynamic models describing the inputs, outputs, and/or functions performed by various sets of building equipment. Equipment models may represent collections of building equipment (e.g., subplants, chiller arrays, etc.) or individual devices (e.g., individual chillers, heaters, pumps, etc.).

Demand response layer 414 may further include or draw upon one or more demand response policy definitions (e.g., databases, XML files, etc.). The policy definitions may be edited or adjusted by a user (e.g., via a graphical user interface) so that the control actions initiated in response to demand inputs may be tailored for the user's application, desired comfort level, particular building equipment, or based on other concerns. For example, the demand response policy definitions can specify which equipment may be turned on or off in response to particular demand inputs, how long a system or piece of equipment should be turned off, what setpoints can be changed, what the allowable set point adjustment range is, how long to hold a high demand setpoint before returning to a normally scheduled setpoint, how close to approach capacity limits, which equipment modes to utilize, the energy transfer rates (e.g., the maximum rate, an alarm rate, other rate boundary information, etc.) into and out of energy storage devices (e.g., thermal storage tanks, battery banks, etc.), and when to dispatch on-site generation of energy (e.g., via fuel cells, a motor generator set, etc.).

Integrated control layer 418 may be configured to use the data input or output of building subsystem integration layer 420 and/or demand response later 414 to make control decisions. Due to the subsystem integration provided by building subsystem integration layer 420, integrated control layer 418 can integrate control activities of the subsystems 428 such that the subsystems 428 behave as a single integrated supersystem. In an exemplary embodiment, integrated control layer 418 includes control logic that uses inputs and outputs from a plurality of building subsystems to provide greater comfort and energy savings relative to the comfort and energy savings that separate subsystems could provide alone. For example, integrated control layer 418 may be configured to use an input from a first subsystem to make an energy-saving control decision for a second subsystem. Results of these decisions can be communicated back to building subsystem integration layer 420.

Integrated control layer 418 is shown to be logically below demand response layer 414. Integrated control layer 418 may be configured to enhance the effectiveness of demand response layer 414 by enabling building subsystems 428 and their respective control loops to be controlled in coordination with demand response layer 414. This configuration may advantageously reduce disruptive demand response behavior relative to conventional systems. For example, integrated control layer 418 may be configured to assure that a demand response-driven upward adjustment to the setpoint for chilled water temperature (or another component that directly or indirectly affects temperature) does not result in an increase in fan energy (or other energy used to cool a space) that would result in greater total building energy use than was saved at the chiller.

Integrated control layer 418 may be configured to provide feedback to demand response layer 414 so that demand response layer 414 checks that constraints (e.g., temperature, lighting levels, etc.) are properly maintained even while demanded load shedding is in progress. The constraints may also include setpoint or sensed boundaries relating to safety, equipment operating limits and performance, comfort, fire codes, electrical codes, energy codes, and the like. Integrated control layer 418 is also logically below fault detection and diagnostics layer 416 and automated measurement and validation layer 412. Integrated control layer 418 may be configured to provide calculated inputs (e.g., aggregations) to these higher levels based on outputs from more than one building subsystem.

Automated measurement and validation (AM&V) layer 412 may be configured to verify that control strategies commanded by integrated control layer 418 or demand response layer 414 are working properly (e.g., using data aggregated by AM&V layer 412, integrated control layer 418, building subsystem integration layer 420, FDD layer 416, or otherwise). The calculations made by AM&V layer 412 may be based on building system energy models and/or equipment models for individual BMS devices or subsystems. For example, AM&V layer 412 may compare a model-predicted output with an actual output from building subsystems 428 to determine an accuracy of the model.

Fault detection and diagnostics (FDD) layer 416 may be configured to provide on-going fault detection for building subsystems 428, building subsystem devices (i.e., building equipment), and control algorithms used by demand response layer 414 and integrated control layer 418. FDD layer 416 may receive data inputs from integrated control layer 418, directly from one or more building subsystems or devices, or from another data source. FDD layer 416 may automatically diagnose and respond to detected faults. The responses to detected or diagnosed faults may include providing an alert message to a user, a maintenance scheduling system, or a control algorithm configured to attempt to repair the fault or to work-around the fault.

FDD layer 416 may be configured to output a specific identification of the faulty component or cause of the fault (e.g., loose damper linkage) using detailed subsystem inputs available at building subsystem integration layer 420. In other exemplary embodiments, FDD layer 416 is configured to provide "fault" events to integrated control layer 418 which executes control strategies and policies in response to the received fault events. According to an exemplary embodiment, FDD layer 416 (or a policy executed by an integrated control engine or business rules engine) may shut-down systems or direct control activities around faulty devices or systems to reduce energy waste, extend equipment life, or assure proper control response.

FDD layer 416 may be configured to store or access a variety of different system data stores (or data points for live data). FDD layer 416 may use some content of the data stores to identify faults at the equipment level (e.g., specific chiller, specific AHU, specific terminal unit, etc.) and other content to identify faults at component or subsystem levels. For example, building subsystems 428 may generate temporal (i.e., time-series) data indicating the performance of BMS 400 and the various components thereof. The data generated by building subsystems 428 may include measured or calculated values that exhibit statistical characteristics and provide information about how the corresponding system or process (e.g., a temperature control process, a flow control process, etc.) is performing in terms of error from its setpoint. These processes can be examined by FDD layer 416 to expose when the system begins to degrade in performance and alert a user to repair the fault before it becomes more severe.

Wireless Mesh Survey Via Wi-Fi

The following disclosure describes a wireless mesh network survey tool for automatically building wireless mesh diagrams, indicating and predicting testing routs, point-to-point test data recording, repeater and/or wireless node positioning recommendations for strengthening wireless mesh networks, and test report generation.

Figure 5:
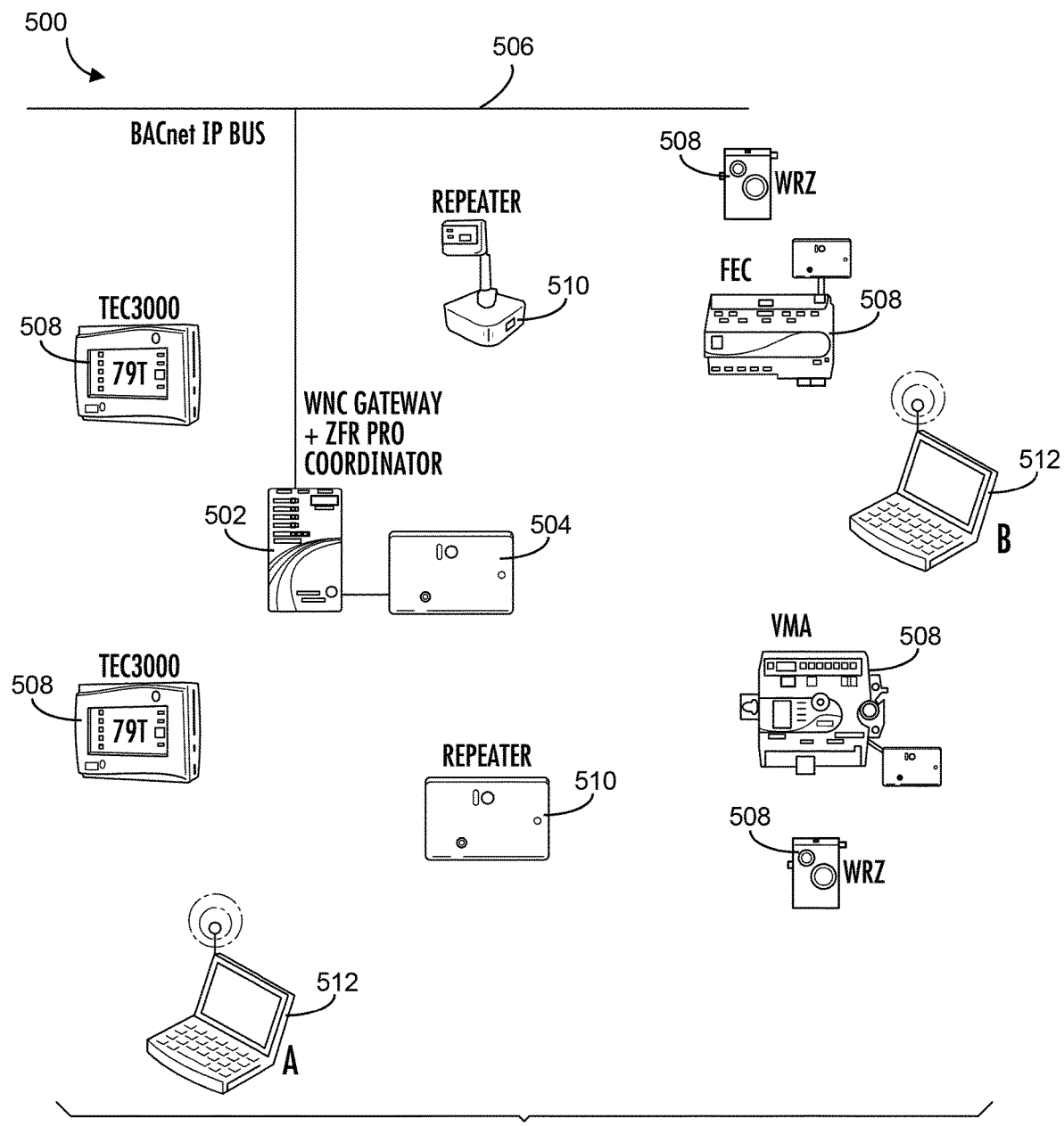
FIG. 5 is a block diagram of a wireless mesh network, according to some embodiments.

Currently, a technician when setting up a wireless mesh network at a site may use various tools for determining the feasibility of installing a wireless mesh network at a site. In one embodiment, the tool may be a WRZ-SST tool from Johnson Controls, Inc. However, the technician still requires a printed scaled site floor plan (paper copy) on which the probable locations of the network coordinator are plotted. Turning now to FIG. 5, an example mesh network 500 is shown, according to some embodiments. The mesh network 500 may include a gateway device 502 and a coordinator device 504. The gateway device 502 may be configured to convert data received over the wireless mesh network 500 into a standard BMS communication protocol such as BACnet IP, and transmit the data over the network bus 506. The coordinator device 504 may be configured to coordinate communication over the wireless mesh network 500. In one embodiment, the wireless mesh network 500 is a ZigBee network (IEEE 802.15.4); however, other wireless mesh network types, including LoRa, Bluetooth, Wi-Fi, and the like are also contemplated. For example, the wireless mesh network is a Wi-Fi network, the mesh network 500 may not include a dedicated coordinator device 504. Instead, the functions of the coordinator device 504 may be distributed between all the nodes in the mesh network 500.

The wireless mesh network 500 may include a number of device 508 as well as one or more repeater devices 510. The wireless mesh network further includes one or more diagnostic tools 512 for analyzing the wireless mesh network. In one embodiment, the diagnostic tool may be used by a technician to determine a possible set-up of the wireless mesh network. For example, the technician may place the diagnostic tool 512 at a probable location of the coordinator device 504, and move to the position of the nearest potential device (e.g. device 508 or repeater device 510) where a separate diagnostic tool 512 is placed to act as a transmitter. The tool may provide a signal strength that the technician may note. The technician then moves across an entire site to determine the signal strength at various points, sometimes requiring multiple diagnostic tools 512.

Figure 7:
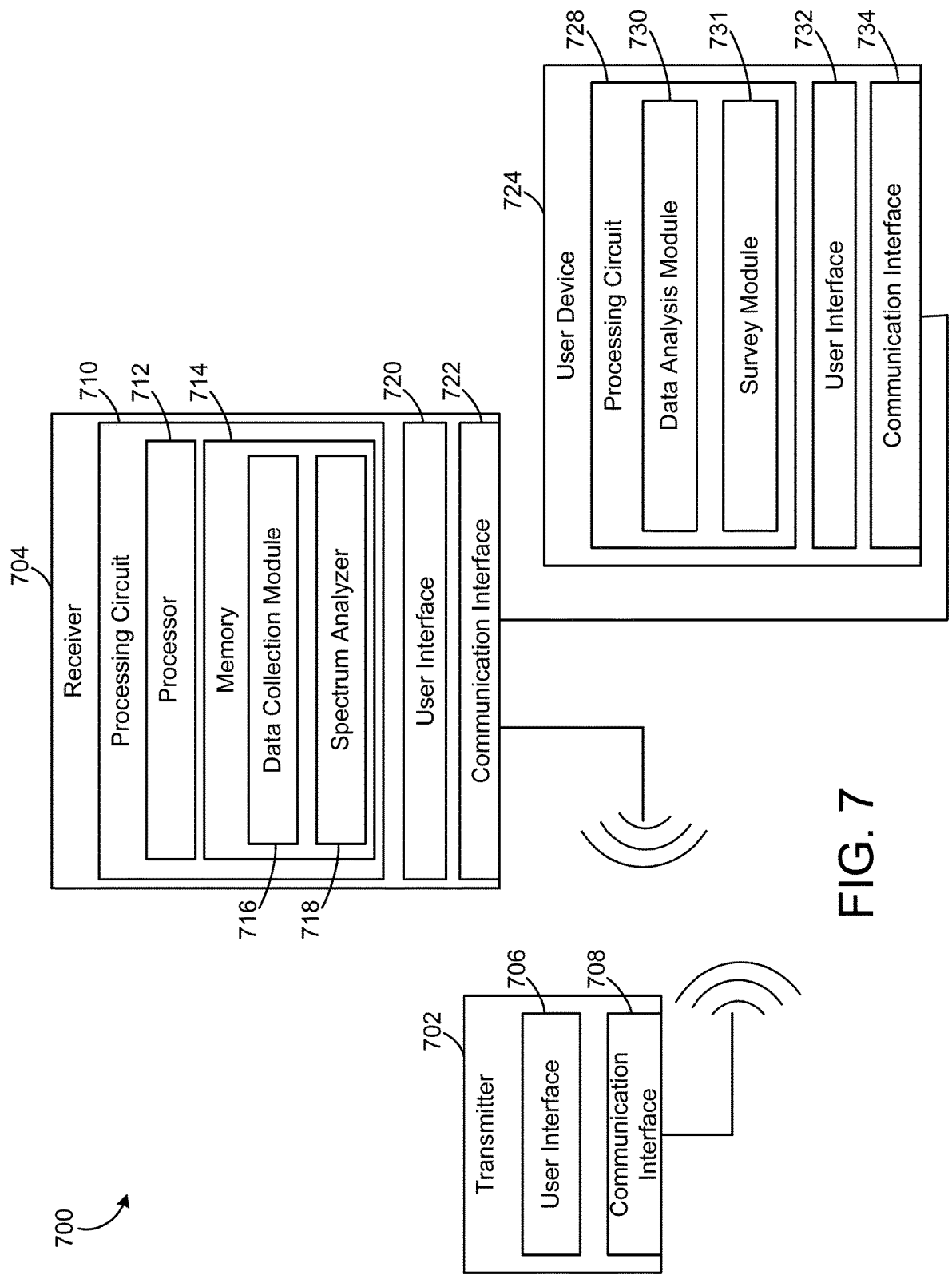
FIG. 7 is a block diagram of a wireless mesh survey tool, according to some embodiments.

In one embodiment, the diagnostic tools 512 can record the data and display the data in a raw format to be analyzed later. For example, FIG. 6 shows a data set 600 of a typical wireless mesh installation. Turning now to FIG. 7, an improved wireless mesh survey tool 700 is shown, according to some embodiments. The survey tool 700 may include a transmitter 702 and a receiver 704. The transmitter 702 may be configured to transmit a signal to the receiver 704. In one embodiment, a user may be able to instruct the transmitter to transmit a signal using a user interface 706 of the transmitter 702. The user interface 706 may be a switch, an actuator, a touch screen display, a keypad, or any other device capable of allowing a user to instruct the transmitter 702 to transmit a signal. In one embodiment, the transmitter transmits a signal via a communication interface 708. In one embodiment, the communication interface 708 is configured to transmit a signal using the same or similar signal used in the communication protocol of a wireless mesh network. For example, the transmitter 702 may be configured to transmit a signal using an IEEE 802.15.4 protocol. However, other protocols are also contemplated.

The receiver 704 may include a processing circuit 710, which may include a processor 712 and a memory 714. The processor 712 may be a general purpose or specific purpose processor, an application specific integrated circuit (ASIC), one or more field programmable gate arrays (FPGAs), a group of processing components, or other suitable processing components. The processor 712 may be configured to execute computer code or instructions stored in memory 714 or received from other computer readable media (e.g., CDROM, network storage, a remote server, etc.).

The memory 714 may include one or more devices (e.g., memory units, memory devices, storage devices, etc.) for storing data and/or computer code for completing and/or facilitating the various processes described in the present disclosure. The memory 714 may include random access memory (RAM), read-only memory (ROM), hard drive storage, temporary storage, non-volatile memory, flash memory, optical memory, or any other suitable memory for storing software objects and/or computer instructions. The memory 714 may include database components, object code components, script components, or any other type of information structure for supporting the various activities and information structures described in the present disclosure. The memory 714 may be communicably connected to the processor 712 and may include computer code for executing (e.g. by processor 712) one or more processes described herein.

The memory 714 may include a data collection module 716 and a spectrum analyzer 718. The data collection module 716 may be configured to collect data received from the transmitter 702. Examples of data collection performed by the data collection module 716 will be described in more detail below. The spectrum analyzer 718 may be configured to analyze one or more frequency spectrums detected by the receiver. The spectrum analyzer 718 will be described in more detail below.

The receiver 704 may further include a user interface 720. The user interface 720 may be a switch, an actuator, a touch screen display, a keypad, or any other device capable of allowing a user to instruct the receiver 704 to receive a signal. In one embodiment, the user interface 720 may provide an indication of the received signal strength received from the transmitter 702. The indication may be a visual indication or an audio indication. The user interface 720 may further display other information to a user, such as other received signals, positioning recommendations, options to record values, etc. While not shown, in some embodiments, the receiver 704 may have a locating device for determining a position of the receiver within a space. Example locating devices may include GPS, Wi-Fi location, cellular triangulation, etc. The receiver may further include a communication interface 722. The communication interface 722 may receive one or more wireless signals. In one embodiment, the communication interface 722 is configured to receive signals in the 2.4 GHz spectrum. In other examples, the communication interface 722 may be configured to receive wireless signals from multiple bandwidths. The communication interface 722 may be specifically configured to receive a signal from the transmitter 702. Further, the communication interface 722 may be configured to transmit one or more wireless signals. For example, the communication interface 722 may transmit a signal to the transmitter 702 to provide operating instructions to the transmitter, such as at what levels to transmit a signal, or to switch channels.

The communication interface 722 may also provide communication to a user device 724. In one embodiment, the communication interface 722 may communicate with the user device 724 via a communication interface 734 of the user device 724. In one embodiment, the communication interface 722 communicates with the user device 724 via a serial communication protocol, such as RS-232, Universal Serial Bus (USB), RS-486, Ethernet (TCP/IP), Firewire, etc. In other embodiments, the communication interface 722 may communicate with the user device 724 via a wireless communication protocol such as Bluetooth, Wi-Fi, cellular (3G, 4G, LTE, CDMA), near field communication (NFC), Zigbee, LoRa, or the like.

In one embodiment, the user device 724 is a personal computing devices such as a laptop computer, a personal computer (PC), a tablet computer, or the like. In some embodiments, the user device 724 may be a mobile device such as a smartphone (e.g. Apple iPhone, Android Phone, Windows Phone, etc.). The user device 724 may include a processing circuit 728. The processing circuit may include a data analysis module 730. The data analysis module 730 may be configured to analyze data provided by the receiver 704. The functions of the data analysis module 730 will be described in more detail below. The processing circuit 728 may further include a survey module 731. The survey module 731 may be configured to generate a proposed wireless mesh network configuration for a given space, as will be described in more detail below. In some embodiments, the data analysis module 730 and the survey module 731 may be applications within the memory 714 of the receiver 704. The user device 724 may further include a user interface 732. The user interface may be configured to display data analyzed by the data analysis module 730. The user interface 732 may further allow for a user to input data or commands into the user device 724, which may then either be processed by the user device 724 or communicated to the receiver 704 using communication interface 734.

The survey module 731 may allow for the testing of potential routes within a space. In one embodiment, a user may upload a floor plan of a space into the survey module 731 which can assist in the testing procedure by directing the user to test certain routes. The survey module 731 may include an advanced mode which can sort out individual network nodes as individual entities and direct the technician to test the signal strength in certain locations in order to optimize on maximum signal strength with the least latency and the within the minimum amount of time needed to complete an efficient site survey analysis. The user may use the receiver 704 to test certain locations, which can then be communicated to the user device 724 for analysis.

The survey module 731 may further be configured to update a location of the user (e.g. the receiver 704) on the uploaded floorplan. Further, the survey module 731 may include an algorithm which can automatically draw a wireless mesh and provide a device count per network, including a minimum required quantity of repeaters, that are required to obtain a sustainable mesh diagram. The user may further be able to point out the location of existing Wi-Fi APs or other wireless devices to allow the survey module 731 to account for possible interference when calculating the wireless mesh. At the end of the test, the data analysis module 730 or the survey module 731 may be configured to generate a technical report summarizing the results of the survey. The report may include heat maps, weak zones, probable locations of repeaters based on the tests performed, etc. The report may provide the raw data as well which can be exported to other devices or systems for further analysis.

Figure 8:
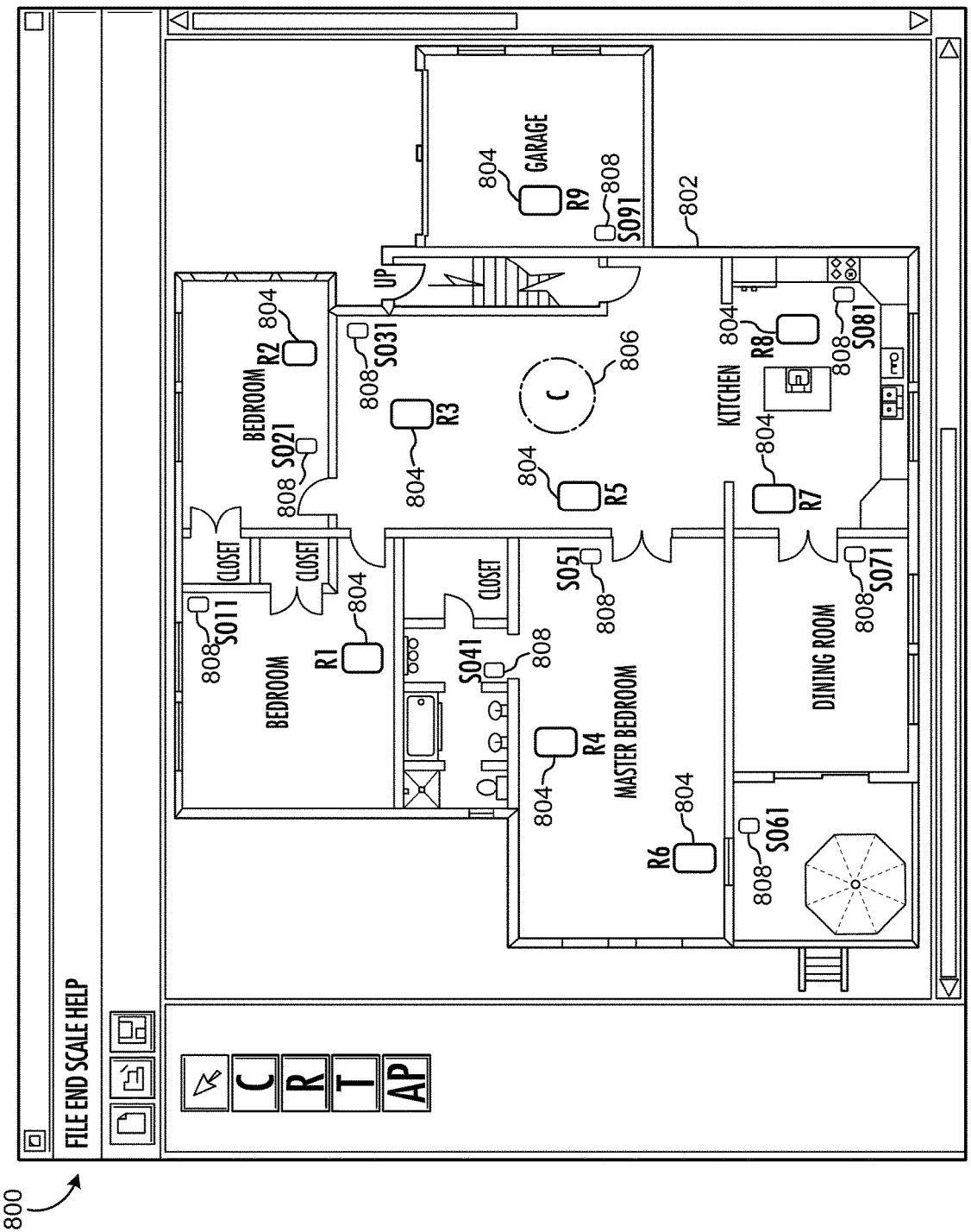
FIG. 8 is a screen shot illustrating a floor plan upload screen, according to some embodiments.

As described above, a user must first upload a floor plan into the system, such as into the survey module 731. The survey module 731 may then determine the scale of the floor plan. In other embodiments, a user may input the scale via the user interface 732. Based on the provided floor plan and scale, the survey module 731 may sort the floor plan so that the internal grids are proper and the distances assumed are approximately similar. The user may then mark the location of a coordinator device in the space as well as point out the location of the routers and sensors in the mesh network. FIG. 8 is a screen shot of a user interface 800 illustrating a floor plan upload screen 802 with various routers 804 (R), a coordinator device 806 (C), and various sensors 808 (S) indicated. The routers 804 may have single digit suffixes which may identify them during the testing process. The sensors 808 may have triple digit suffixes for identification purposes.

Figure 9:
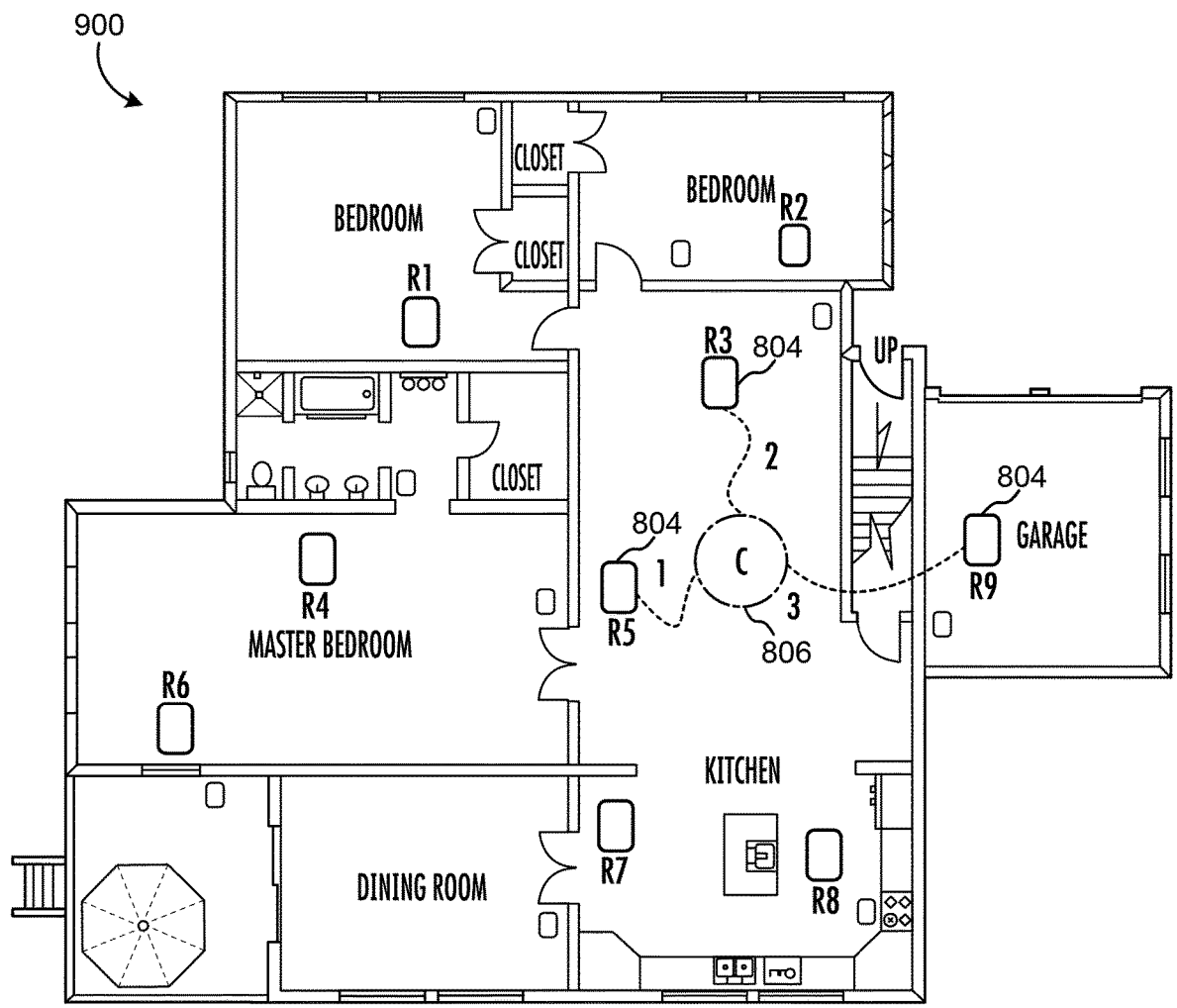
FIG. 9 is a screen shot illustrating a sorting process result, according to some embodiments.

The survey module 731 may then sort out the routers 804 that are closest in distance to the coordinator device 806 (C). The survey module 731 will then attempt to sort the routers 804 based on an increasing distance of the routers from the coordinator device 806 (C). Turning now to FIG. 9, an example result 900 of the above described sorting process is shown, according to some embodiments. As shown in FIG. 9, after the initial sorting, three routers 804 (R3, R5, R9) are determined to be within fifty feet of the coordinator device 806 (C). (In some examples, the coordinator device 806 (C) is allowed to sort as many devices (e.g., routers 804) it can within the 50 feet scaled mark). Thus, FIG. 9 provides the beginning of a mesh network map to be generated with the coordinator device 806 (C) in the center. The survey module 731 can determine the devices which are within fifty feet of the coordinator device 806 (C). However, other distances may also be used. The user may then be instructed to test the signal strength at the identified routers 804 (R3, R5, R9).

The survey module 731 may then create an array containing the available devices found within range of the coordinator device 806 (C). At the same time, the survey module 731 may generate a separate array containing a list of unavailable devices. This may be made up of a list of devices that are not within the set distance (e.g. fifty feet) of the coordinator device 806 (C). The arrays based on FIG. 9 are shown in Table 1, below.

TABLE 1

| Available Devices | Unavailable Devices |
| --- | --- |
| R3 | R1 |
| R5 | R2 |
| R9 | R4 |
|  | R6 |
|  | R7 |
|  | R8 |

After the nearest devices to the coordinator device 806 (C) are sorted, the survey module 731 may then determine devices within the range of the identified available devices described above. As the survey module 731 sorts the additional devices, an internal counter for these devices will increment. For the available devices within range of the coordinator device 806, the counter will already be incremented to 1 as they are already in the neighbor list of the coordinator device 806 (C). As the available devices begin finding their neighbor units, the counter increments and finishes once all the devices have been scanned. An example list of neighbor devices of router device 804 (R5) is shown in Table 2, below.

TABLE 2

| Device Name | Neighbor from Available List | Neighbor From Unavailable List |
| --- | --- | --- |
| R5 | R3 | R4 |
|  | R9 | R7 |
|  |  | R8 |

Figure 10:
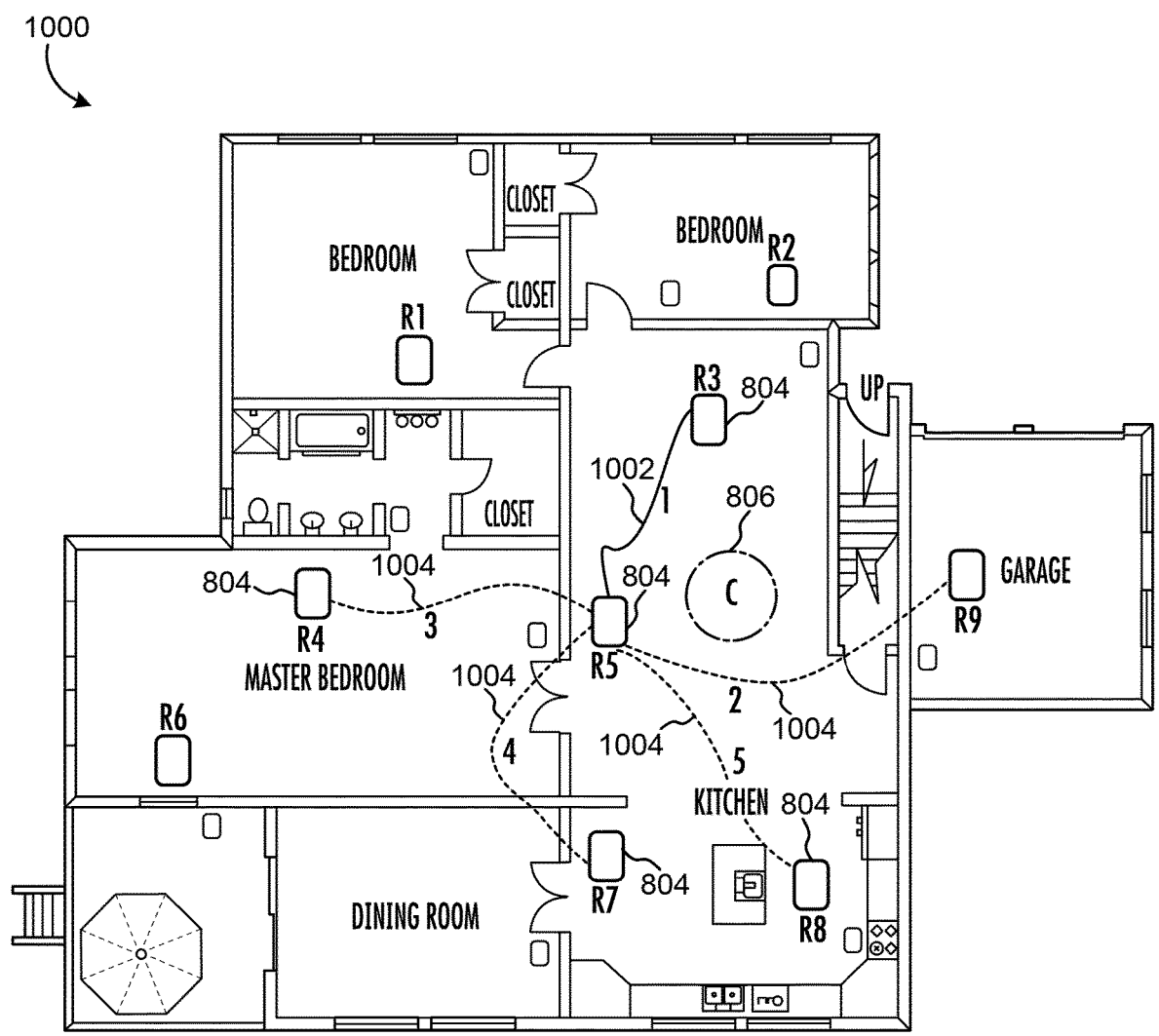
FIG. 10 is a wireless mesh network diagram illustrating a mesh network after an initial device scan has been performed, according to some embodiments.

Referring now to FIG. 10, a wireless mesh network diagram 1000 illustrating a mesh network after an initial device scan has been performed is shown, according to some embodiments. Once the scan is completed, an internal array of the survey module 731 registers all the devices and only filters out the two closest devices to be in the neighbor list. As router 804 (R5) is already associated as a neighbor of the coordinator device 806 (C), it already had its associated neighbor counter incremented by one. Hence, router 804 (R5) has only marked a single router 804 (R3) with a solid line 1002, as shown in FIG. 10. The survey module 731 may then mark all other entries in the neighbor list with dotted lines 1004 as shown in FIG. 10. The survey module 731 then generates a final list of all the neighbors for the routers 804. As the survey module 731 finds out other neighbors and registers them, counters are incremented at both the source node and the neighbor node. All other neighbor nodes are kept as the backup and are not mandatory to be checked or tested. The routers which appear in the neighbor list of the source node are also incremented with a +1 in their respective neighbor count list.

Figure 11:
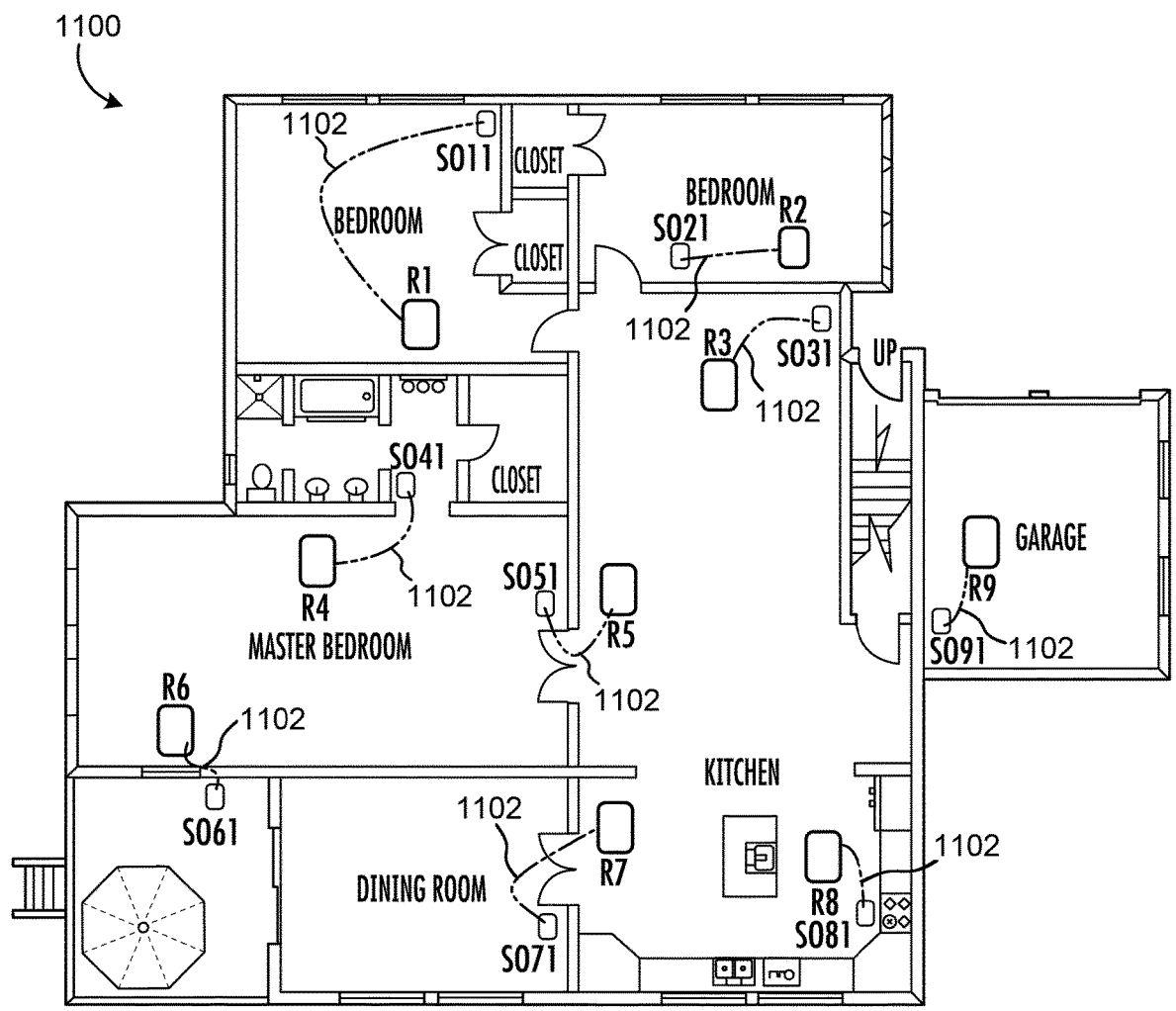
FIG. 11 is a wireless mesh network diagram illustrating one or more direct routes from devices to a respective router, according to some embodiments.

As the scan is completed for all the devices in the space, individual maps may be generated for all of the router nodes based on their neighbor list and two important routes to the coordinator that the user needs to test out. Once the neighbor list for all the routers 804 is completed, the survey module 731 may then check for the wireless coverage of the devices (e.g. sensors) in the space. As shown in the floor plan 1100 of FIG. 11, the sensor devices are marked with a three-digit suffix. In some embodiments, the first two digits may represent a target controller number and the last digit may represent a zone number. As shown in FIG. 11, the direct routes from the devices to their respective routers are shown via the solid lines 1102. The user may be directed by the survey module 731 to test along the end points of the routes indicated in FIG. 11. For example, the user may be required to manually go out to the site to test the node points to confirm the signal strengths across the network, such as by using survey tool 700. Once the test is completed for all the nodes in the site, the user gets a pop up suggesting the user "create mesh" on a user interface (e.g., user interface 732, user interface 720, described above with reference to FIG. 7). If the user selects a "create mesh," option on the user interface, the survey module 731 may create a wireless mesh network based on the data recorded as well as the scale of the floor plan. The user is then presented with a field report with a wireless mesh network diagram indicating possible weak zones, lone nodes and weak route. The survey module 731 may also provide one or more suggestions to the user, such as recommending the addition of additional repeater devices (e.g., repeater device 510, described above with reference to FIG. 5) if a zone is weak.

Capture Mode

Once the user reaches the site, the user may initiate a collection mode. In one embodiment, the user may select the capture mode via the user interface 732 of the user device 724. In other examples, the user may select the capture mode via the user interface 720 of the receiver 704. Example capture modes may include one-to-one mode, mesh mode, and a graph mode. In one-to-one mode, the data for the individual routes will be determined point-wise. An example one-to-one mode point-wise determination is shown in Table 3, below.

user moves from one node to another, they will have the responsibility to "set" the capture and "reset" the capture. The survey module 731 will continue to monitor and record the data once "Set" is on. This kind of capture is required for point to point analysis through which the application knows the signal strength and effective data rates between the node points.

Figure 12:
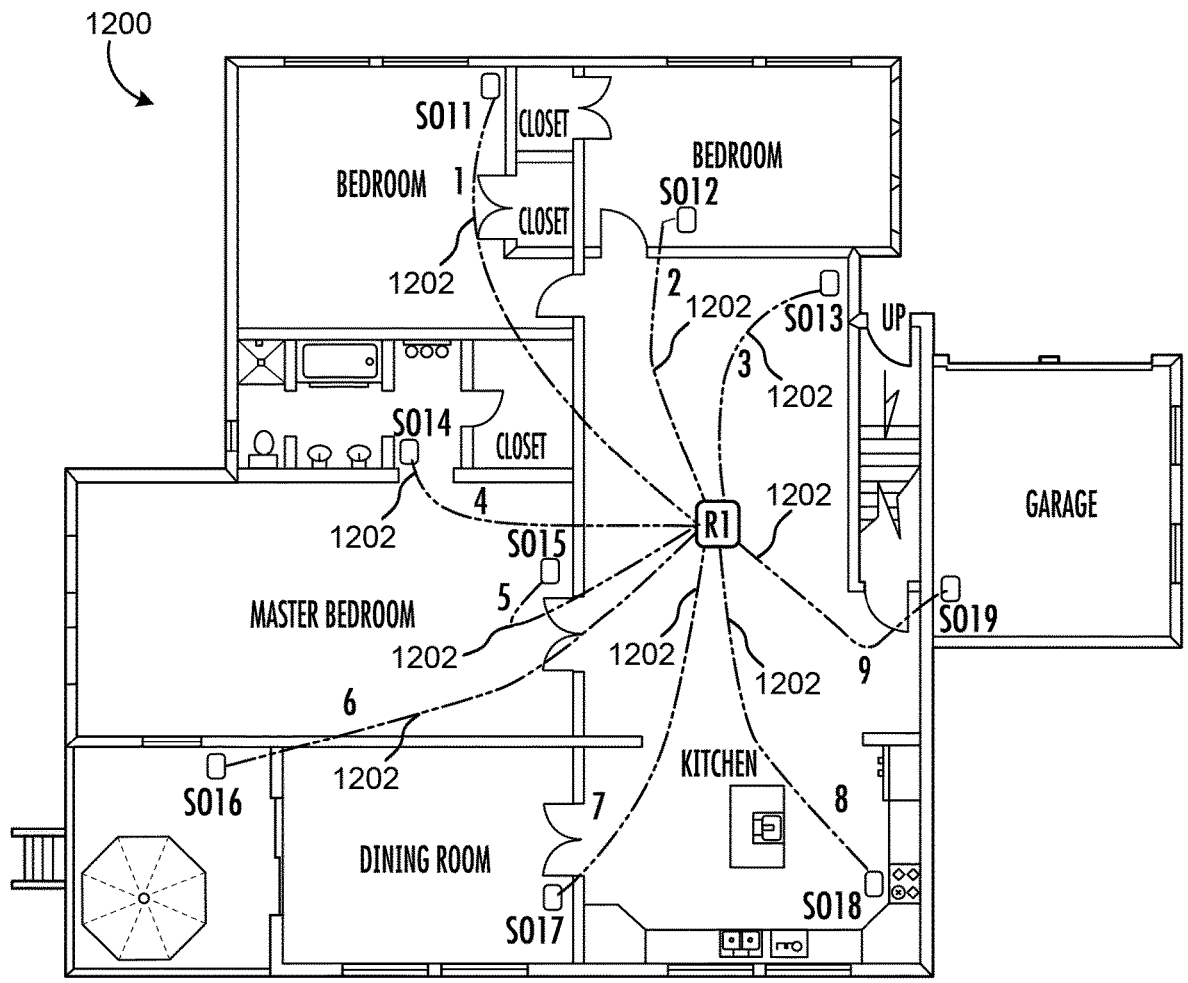
FIG. 12 is a diagrammatic representation of a mesh mode process, according to some embodiments.

In the mesh mode, the receiver 704 will have the capability to associate with and receive data transmissions from up to nine transmitters 702 at a time. This mode may be advantageous in determining the position of a router with respect to one or more devices. In some instances, to capture a particular sensor, a router may be required to be placed at a substantial distance, due to which signal transmissions from other configured devices were very weak. Using the mesh mode solution, the survey module 731 can predict the optimum location of the receiver 704 and can also predict a requirement of repeater if the signal strength between the device and the receiver is determined to be weak. A diagrammatic representation 1200 of the mesh mode process is shown in FIG. 12. As shown in FIG. 12, route paths 1202 are given numbers based on the devices they are associated with. This is necessary to evaluate and configure a particular device to have the same configuration (as generated in the map shown in FIG. 12) for analysis.

Figure 13:
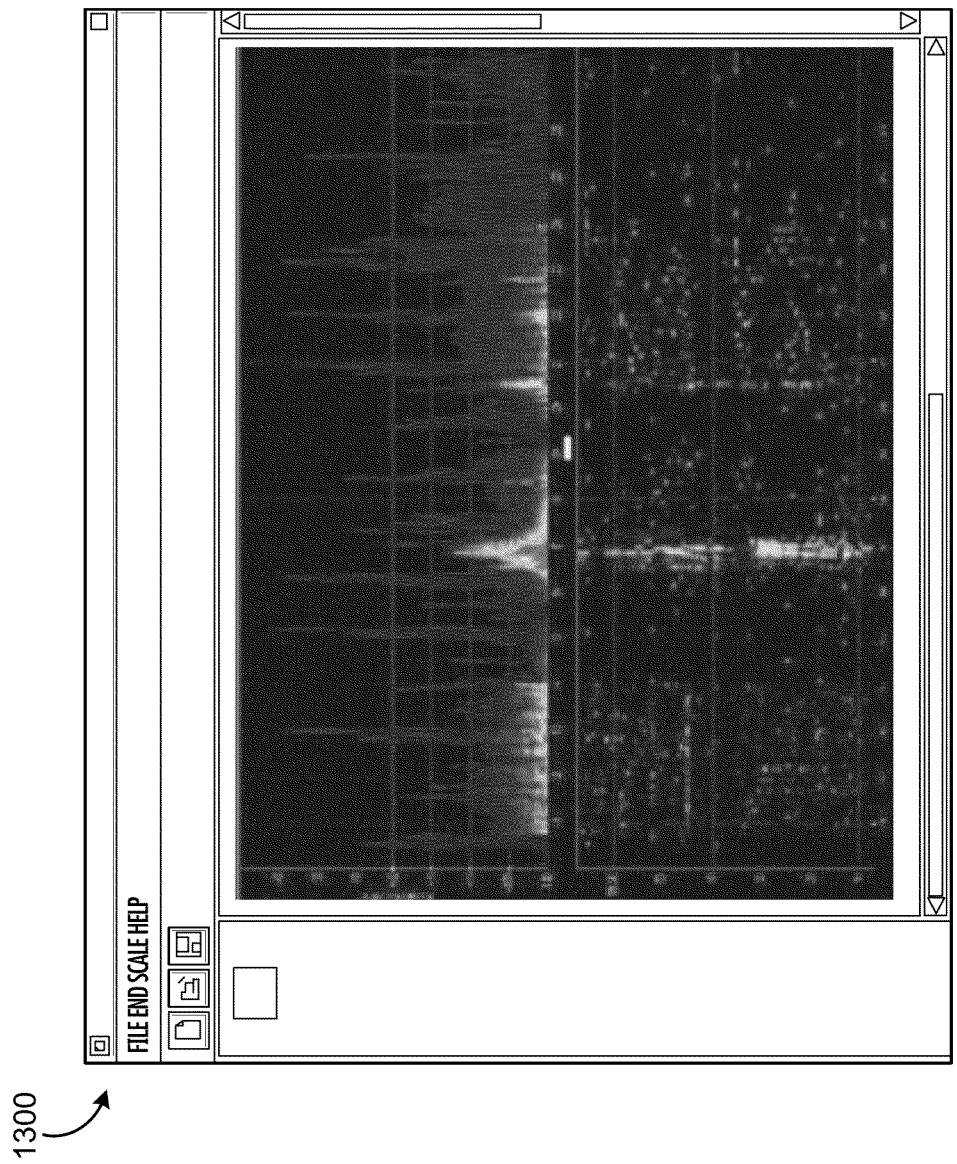
FIG. 13 is a screen shot of a user interface illustrating a 2.4 GHz spectrum in a wireless mesh network, according to some embodiments.

In the graph mode, the receiver 704 may continuously scan across channels (11-26) of the 2.4 GHz spectrum. This can allow interferences within the spectrum to be determined. The different channels and their subsequent utilizations may be shown via a spectrum graph 1300 that may be a component of the user interface 732 of the user device 724, as shown in FIG. 13. In one embodiment, the receiver 704 may use the spectrum analyzer 718 to scan the channels (11-26).

The survey module 731 may further allow the user to provide comments and/or attachments based on the capture process. In one embodiment, the user may enter the comments and attachments using the user interface 732 of the user device 724. For example, in some examples, there may be devices or obstructions that can affect signal strength. Also, it might occur that near the probable location of a router, there may be a previously placed Wi-Fi AP in the vicinity, which can be noted by the user. Further, the user may be able to attach images or videos depicting site conditions. This information can also be provided to users responsible for other sites for assessment and learning purposes.

Site Testing

Once the scaled floor plan is uploaded and the testing routes have been predicted, the site may then be tested to determine a wireless health. First, the technician takes a print out of all of the router nodes previously put into the network. The survey module 731 may generate a map of all routers and coordinators in the system for review by the technician. The technician then places the receiver 704 at the

TABLE 3

| Route Name | Delta Time | Bytes of Data | RSSI dB | Data Link Test | Speed kbps | CRC Tx | CRC Rx | Remarks |
|---|---|---|---|---|---|---|---|---|
| A-B | x.xxx minutes | XxxkB | x dB | X % | X % | X % | X % | Good/Bad/Ugly |

Figure 14:
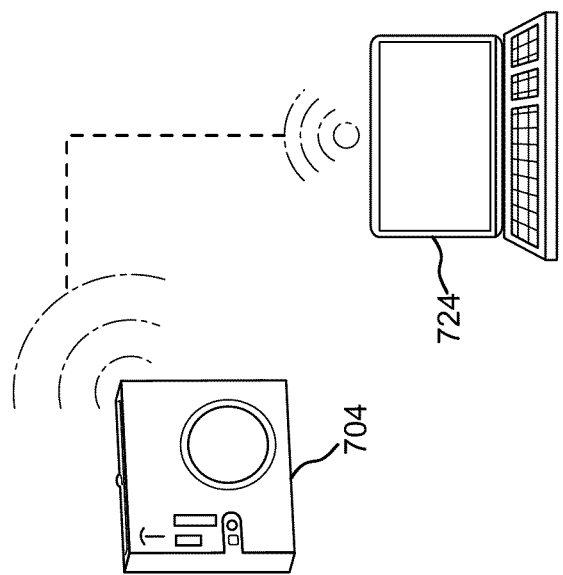
FIG. 14 is an example connection scheme between a user device and a receiver in a wireless mesh network, according to some embodiments.

The above list may be displayed to the user via the user interface 732 and/or user interface 720. The one-to-one data list may be downloaded as a data file (e.g. .xls, .csv, etc.) for future reference and analysis. In the one-to-one mode, as the position of the coordinator (C), as identified in the floor plan. The receiver 704 is then connected to the user device 724, as described above. FIG. 14 shows an example connection scheme between the user device 724 and the receiver 704.

Figure 15:
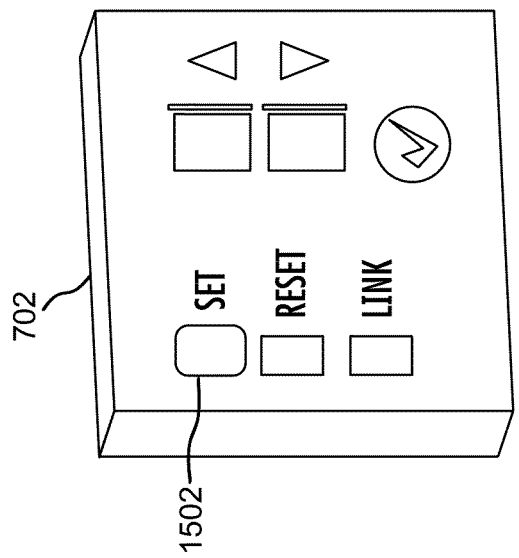
FIG. 15 is a possible physical embodiment of the transmitter of FIG. 7, according to some embodiments.

The technician then moves to a location associated with the nearest router, as depicted in the generated floor plan described above. Once reaching the position of the first router, for example router 804 R3 shown in FIG. 9, the technician may update the position of the transmitter 702. In one embodiment, the technician may update the position of the transmitter via the user interface 706. In some embodiment, the user interface 706 of the transmitter 702 may indicate both the associated receiver 704 that it is communicating with, as well as the route being tested (for example, route 2). The technician may further use the user interface 706 to initiate communication between the receiver 704 and the transmitter 702. FIG. 15 illustrates one possible physical embodiment of the transmitter 702.

In one configuration, the transmitter is set to test route 2 (R3) with the coordinator device (C) at the center. As shown in FIG. 15, the technician may establish communication with the receiver 704 by pressing the set button 1502 on the transmitter 702. The user interface 706 may then verify that the connection has been established. In one embodiment, the user interface 706 may provide an indication of the strength of the signal between the transmitter and the receiver 704. For example, the user interface 706 may include one or more visual indicators, such as LEDs, where three blinks represents a very good connection, two blinks indicate a good connection, and one blink indicates a poor connection. In one embodiment, the transmitter 702 may transmit a signal every three seconds. The receiver 704 may receive the signal, capture the position of the transmitter (e.g. which router or device is it testing), and captures the data on a point-to-point basis. Once the test is completed from one point, the technician may reset the transmitter 702 to pause the communication, moves to a new location, changes the route information, and repeats the above process. The above process may be used for routers, coordinators and devices associated with the desired mesh network.

Data Analysis

Figure 16:
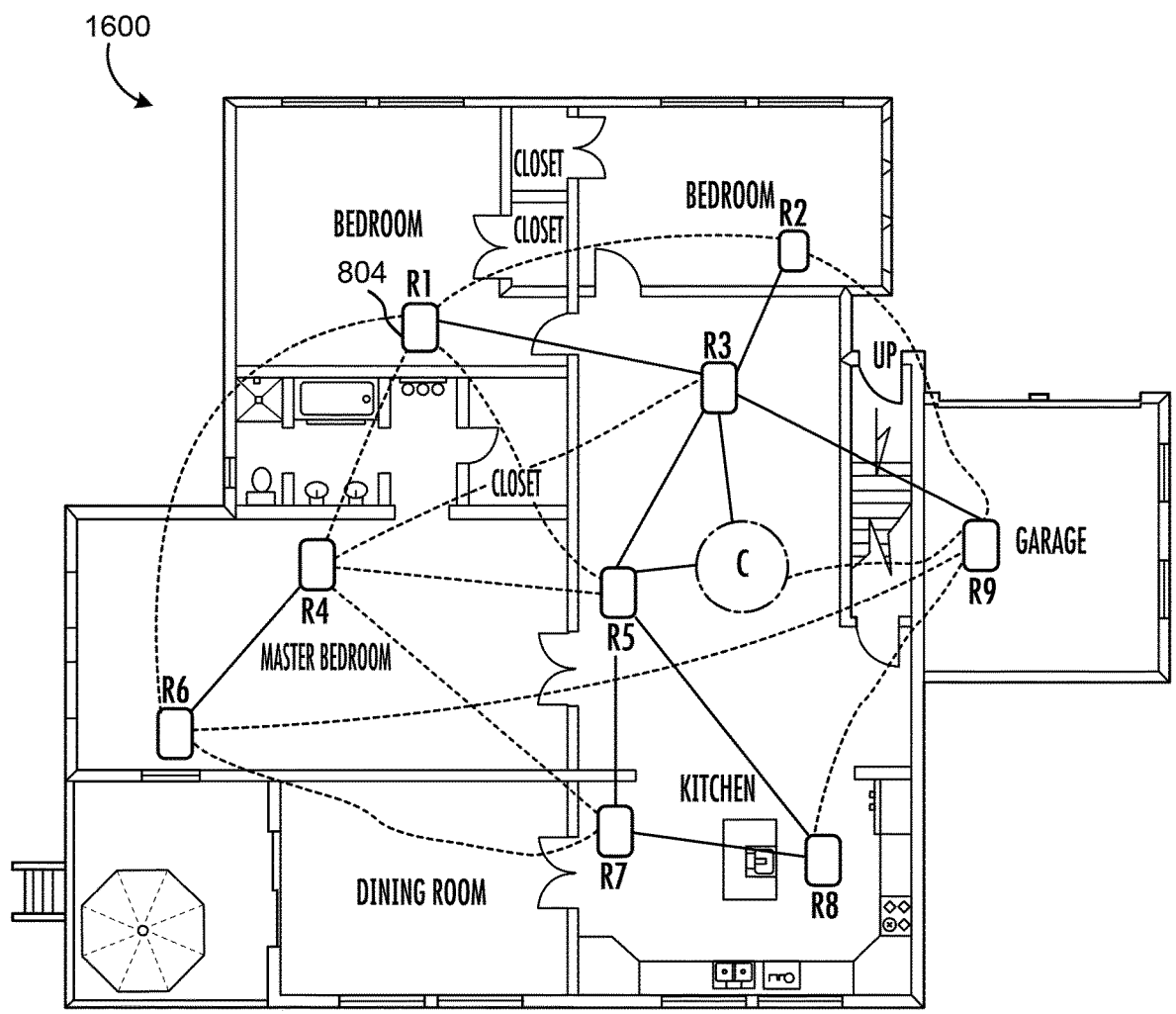
FIG. 16 is a possible mesh network based on the site described in FIG. 9, according to some embodiments.

Referring now to FIG. 16, a possible mesh network for a floor plan 1600 is shown based on the site described above in at least FIG. 9. Once the test is complete, the user can save the data from the application. The survey module 731 may then generate a mesh diagram for the floor plan 1600. In one embodiment, the survey module 731 can generate multiple types of mesh diagrams, including: entire networks depicting the communication between routers; entire networks depicting the communication between devices and routers; individual routers with their neighbors and the coordinator; and individual routers with their configured devices. Further, the survey module 731 may generate a route summary for a particular router 804 (e.g., router R1 as shown in Table 4, below). In some embodiments, the varying signal strengths may be displayed on a user interface (e.g., user interface 732, user interface 720, described above with reference to FIG. 7) as indicated in Table 4.

TABLE 4

| ROUTE descriptions (Source Node - R1) | Signal Strengths |
|---|---|
| R1-R2 | Medium (dotted yellow) |
| R1-R3 | Strong (solid yellow) |
| R1-R6 | Weak (dashed yellow) |
| R1-R4 | Weak (dashed yellow) |
| R1-R5 | Medium (dotted yellow) |

The mesh diagram shown in FIG. 16 may also indicate where probable weak spots are, as well as recommended locations to add optional repeater devices in order to enhance signal strength.

In one embodiment, the data analysis module 730 analyzes the data provided by the survey module 731 to generate the above recommendations. In some embodiments, the data analysis module 730 may include additional factors associated with the site when analyzing the data. For example, the data analysis module may include building materials, ceiling materials, and wall materials in its analysis. The data analysis module 730 may further be configured to fetch data from existing site conditions over time to compare with the physical building materials, device layouts and health of the device to improve the algorithm and predict near accurate results for upcoming jobs. Further, while in the above embodiments the position of the coordinator (C) was manually determined by the user, in some embodiments, the survey module 731 may be able to determine an optimum location for the coordinator based on the building materials and the layout of the site.

Mesh Network Configuration and Analysis Tool

Diagnostics on mesh networks generally require a specific software drivers to be installed onto a computing device, such as a laptop. Further, a hardware interface is generally required to be provide an interface between the computing device and the network. This requires a technician or user to physically travel to a site in order to configure and analyze a mesh network. The following disclosure describes a tool to allow for remote configuration and analysis of a wireless mesh network. The below tool removes the need for the separate hardware interface currently required.

Figure 17:
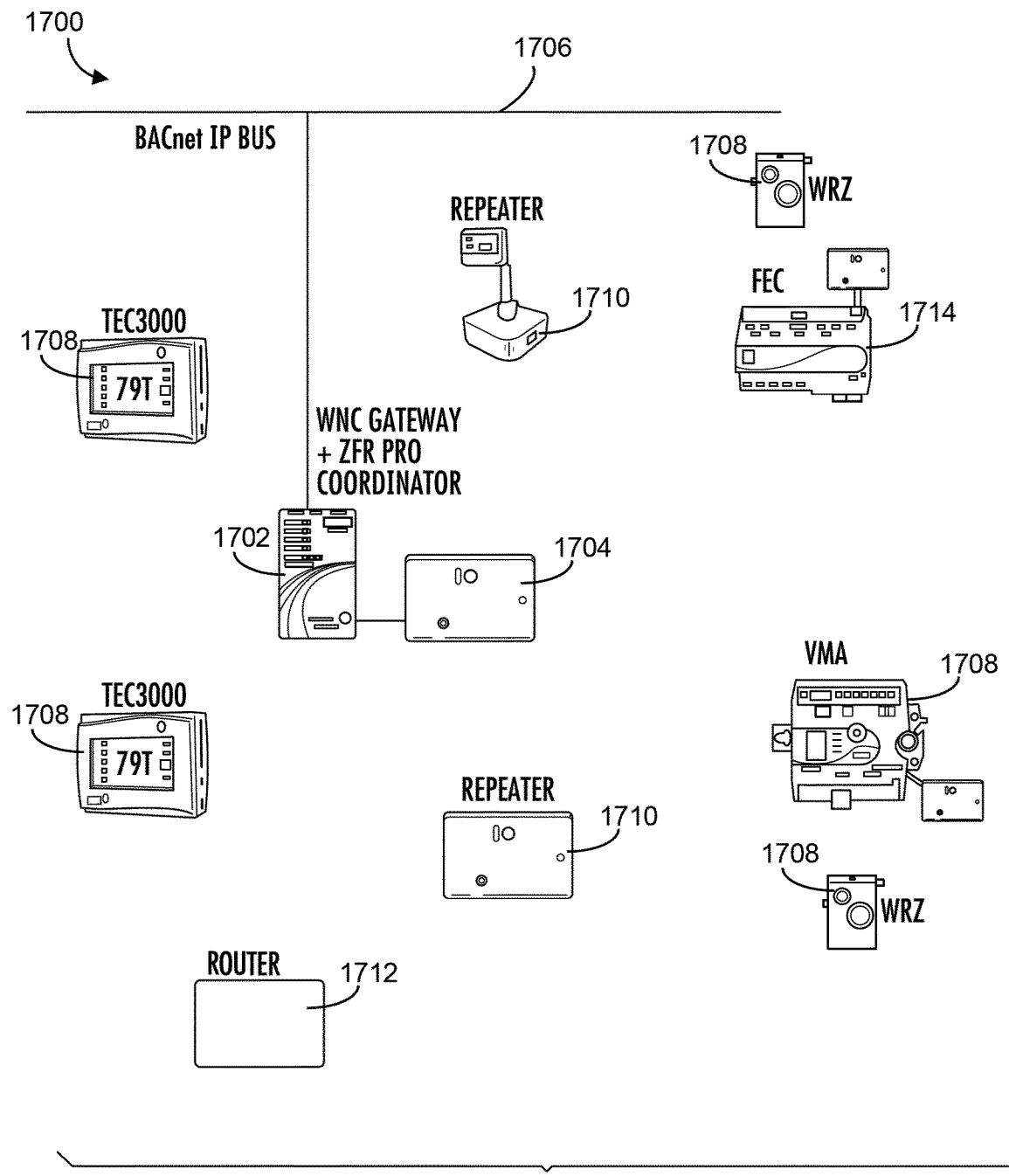
FIG. 17 is an example mesh network, according to some embodiments.

Turning now to FIG. 17 an example mesh network 1700 is shown according to some embodiments. The mesh network 1700 may include one or more devices 1708, repeaters 1710, routers 1712, and field equipment controllers 1714. The mesh network 1700 may further include a coordinator device 1704 connected to a gateway device 1702. The coordinator device 1704, if present, is configured to manage the wireless mesh network. The gateway device 1702 is configured to convert data received from the wireless devices by the coordinator device 1704 onto a network. For example, the gateway device 1702 may convert the received data into a BACnet IP format, and transmit the data over the network bus 1706. However, other network formats such as TCP/IP are also contemplated. The coordinator device 1704 may also be configured in building and maintaining the wireless mesh network and all of the devices 1708. The routers 1712 are configured to report to the coordinator device 1704 as per token availability and to push data to the gateway device 1702. The wireless mesh network 1700 is constructed in such a way that each router 1712 falls under the neighbor list of at least two other routers 1712. Thus, the associated devices hop messages through their respective neighbors in order to reach the coordinator.

In the mesh network 1700, the coordinator device 1704 may be configured to perform network diagnostics and push the data to the gateway device 1702. A technician may be able to log into the gateway device 1702 to access the data. In some embodiments, the gateway device 1702 can push the received data over the internet, such as to a cloud-based service. In some examples, the gateway device 1702 may push the data to the internet based on a predefined schedule, such that the data will be available to a technician. In one embodiment, the coordinator device 1704 can collect network traffic within the mesh network. The coordinator device 1704 may capture the network traffic over an adjustable period of time. This can enable a technician to analyze the network and understand possible issues. The technician may then be able to troubleshoot any detected problems. In some examples, the coordinator device 1704 can run a sniffing algorithm in parallel with its normal operations.

In the mesh network 1700, the devices 1708 may be configured to send out periodical data updates to the configured field controllers 1714 which in turn may pass data to the coordinator device 1704 which then pushes the data to the gateway device 1702 based on token availability. Thus, the coordinator device 1704 will have access to all the relevant data of the devices. The coordinator device 1704 may be further configured to perform periodic network scans for configurable time periods and then provide this data to the gateway device 1702. In one embodiment, the coordinator device 1704 is connected to the gateway device 1702 via an RS-485 serial interface.

Figure 18:
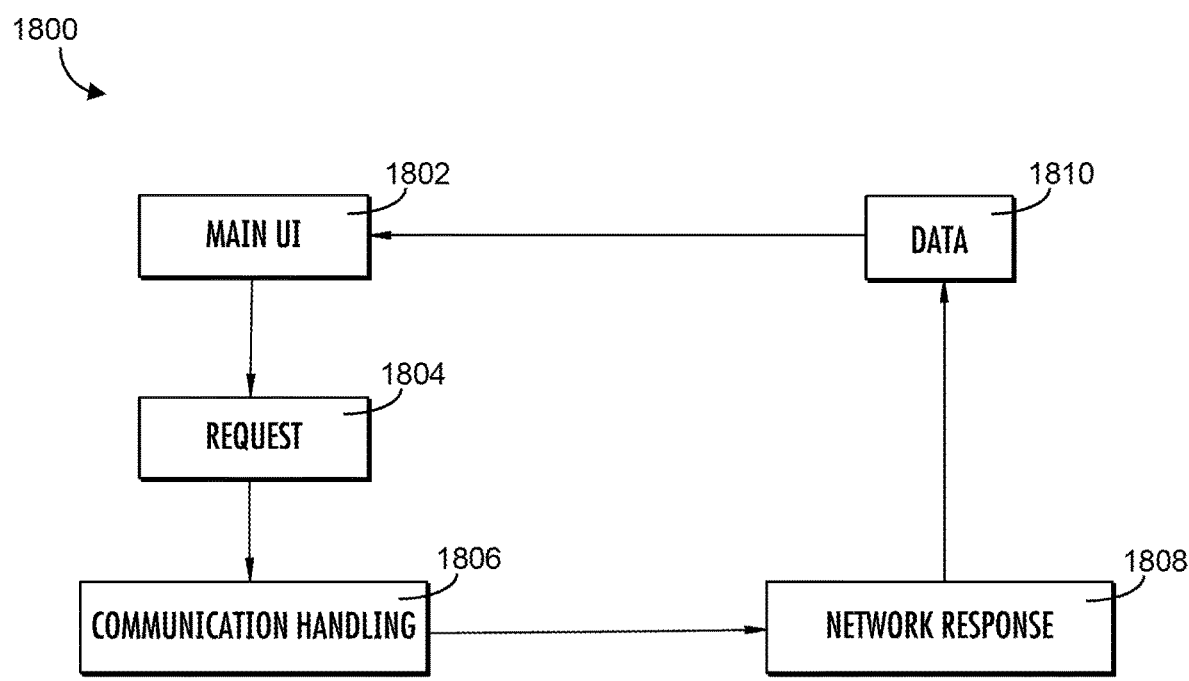
FIG. 18 is a schematic diagram illustrating a sequential data flow between one or more devices in a wireless mesh network.

Turning now to FIG. 18, a schematic illustrating the sequential data flow between devices or other components in a mesh network is shown according to some embodiments. As shown in FIG. 18, multiple objects are shown which may help maintain the required data flow. The main UI 1802 is a software layer responsible for handling the front end of the application wherein a user gets to view the UI, call for requests and fetch data from previous scans. The request element 1804 is a software layer that enables the user to perform a request to perform a data scan on demand. This request can be self-driven or user dependent. In case of a self-driven scheduled based approach, a pre-defined schedule enables this layer periodically based on a preset time to impact on the communication handling layer 1806. The communication handling layer 1806 is configured to initiate a communication link between the serial interface of the gateway (e.g., gateway device 1702) and the coordinator device (e.g., coordinator device 1704) upon an arrival of a request from the request layer. The communication handling layer 1806 is configured to check for the medium, error reporting in case of faulty communication links and report the status of the communication. The network response layer 1808 is responsible for consolidating network traffic received from other wireless devices and caching it to pass it on to the next layer. The network response layer 1808 has the responsibility to enable the coordinator device to pass on request to network devices, sort data, obtain their responses, and maintain a counter to compare with the list of previously discovered devices to find out any unexpected behavior of a particular node. The data layer 1810 is responsible for parsing the raw data that it received from the network response layer 1808 and displaying it in a user-presentable way over the interface. The data layer 1810 is also responsible for performing the analytics of the raw data and presenting to the user any significant changes in the network structure that might affect the network in the future.

The main UI 1802 may address requests from users to perform a network analysis. The coordinator device may have loopback port to sniff the network data and can push a code snippet into the radio to perform the scan. FIG. 19 depicts this code snippet 1900. The sniff functionality may be within the coordinator device. The sniff functionality may providing monitoring of the network over an extended period of time rather than having a snapshot version of the network. Accordingly, the sniff function may capture a number of network packets filtered only by the IEEE 802.15.4 ZigBee traffic. Also, the sniff function may have the capability to create .pcap files which can then be used for further offline data analysis. The sniff function may call for an available socket in the coordinator radio, and the function will have the parameters through which it may call the available time for the sniff. In the first implementation, a configurable time of twenty-four hours may be the time period over which the sniff function is performed. However, other time periods are also contemplated. In one embodiment, the time period may be determined by a memory capacity of the coordinator device.

The functionality of the functions within the code snippet 1900 of FIG. 19 are discussed below. A sniff packet may include the following configuration: sniff (prn=none, lfilter=none, count=0, store=1, offline=none, L2socket=none, timeout=none.) Wherein count is equal to the number of packets to capture. Zero count may be construed to mean infinity. Store may be determine whether to store the sniffed packets or discard them. If the store is set to zero, no packets will be stored. The prn function is a function to apply to each packet, wherein if something is returned, it is displayed. For example, prn may be configured to =lambda x: x.summary( ). lfilter may be a python function applied to each packet to determine if a further action may be performed on the packet. For example, lfilter=lambda x: x.haslayer (padding). Offline may be a .pcap file to read packets from, instead of sniffing them. In some cases a BPF filter will not work. Timeout may provide a command to stop sniffing after a predetermined period of time. Finally, L2socket can allow for a supersocket to be provided for sniffing instead of the one from conf.L2listen.

The above described analysis tool may be incorporated into the coordinator device and/or the gateway device with the help of software changes. For example, a new application may be used to take in the request to process a network scan request in addition to the normal function of a gateway. This application may have various interfaces in the UI through which a user may be able to access resources and request the services of one or more functions of the tool.

Figure 20:
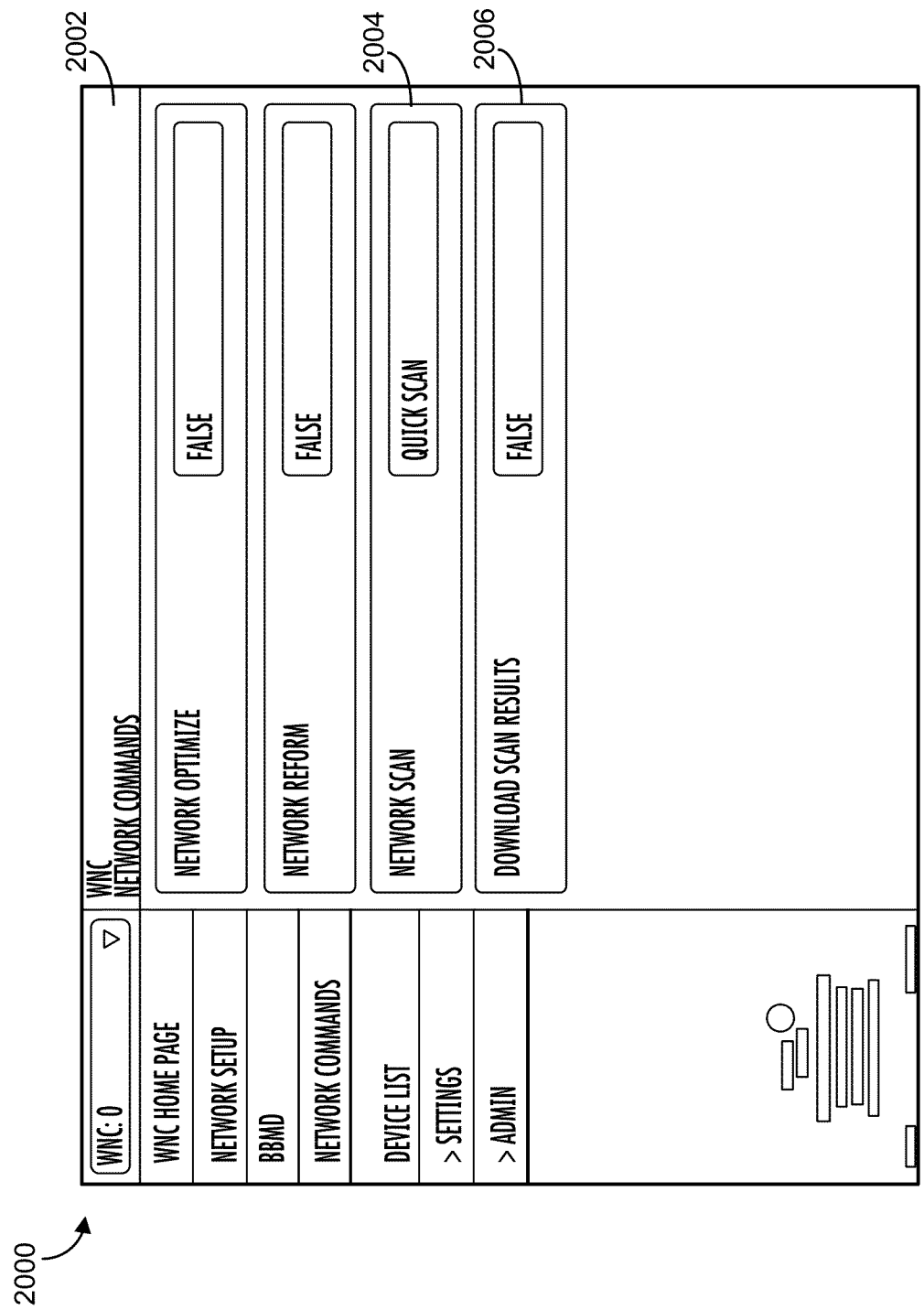
FIG. 20 is a screen shot illustrating a network scan interface, according to some embodiments.

Turning now to FIG. 20, a screen shot illustrating a network scan interface 2000 is shown. As shown in the interface 2000, a network scan function 2004 is shown within the network commands screen 2002. Additionally, a download scan results function 2006 may also be present. The download scan results function 2006 can download scan results of the mesh network onto a user device. In some embodiments, the network scan function 2004 may include a quick scan or an extensive scan function.

Figure 21:
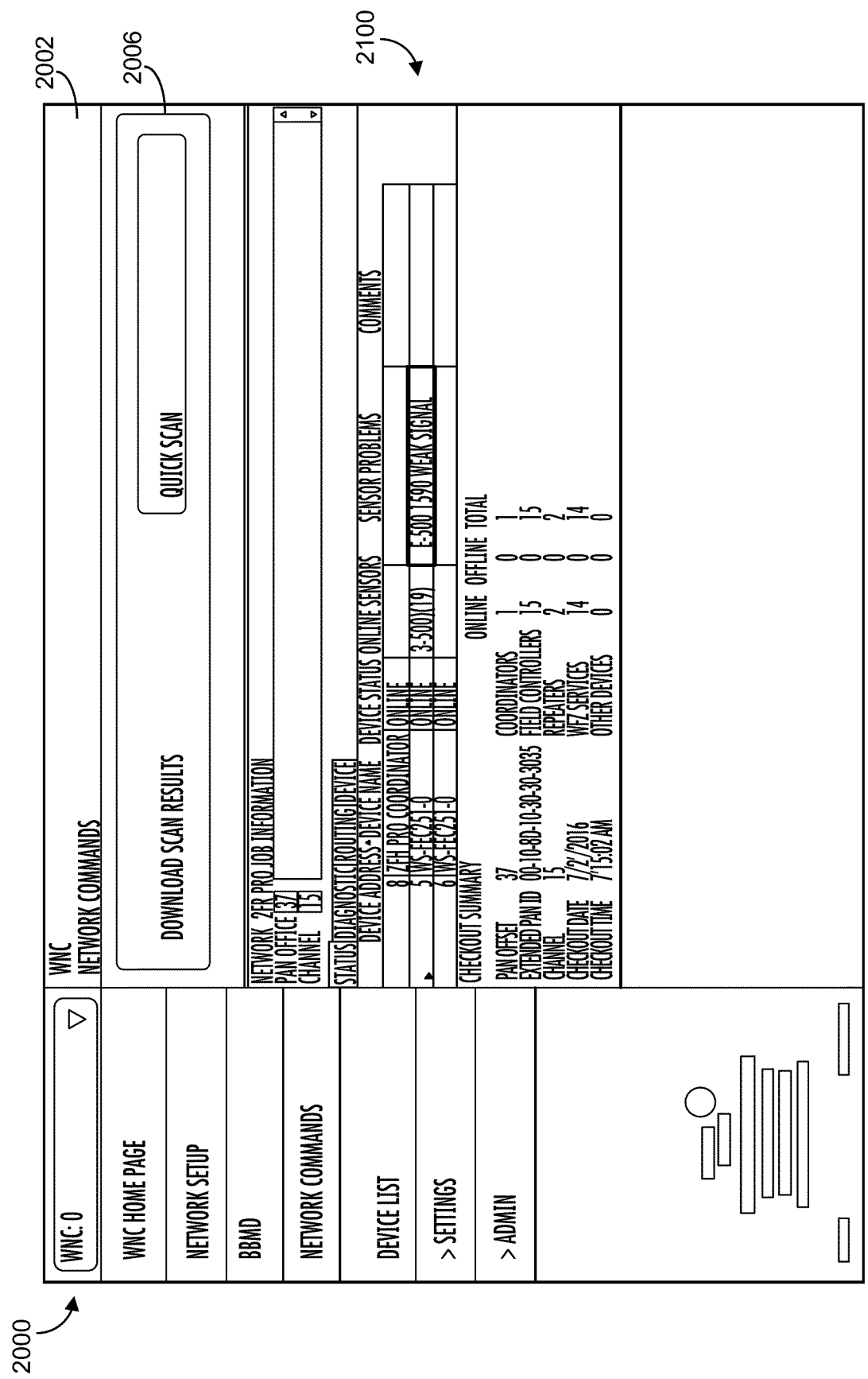
FIG. 21 is a summary of the wireless traffic in a wireless mesh network, according to some embodiments.

In the quick scan function, the network manager may have the responsibility to diagnose the network for only a brief period of time. The quick scan function may call the coordinator device to listen to all the activities of network devices and return the data. The quick scan will ensure that all device are online and is useful in cases wherein a site is just installed with the JCI wireless devices and the technician wants to verify status & health of all the available devices. The quick scan will then present a user with a summary of the wireless network traffic as shown in FIG. 21. As shown in FIG. 21, a preview 2100 of the scan results from a quick scan may be shown in interface 2000. Use of the quick scan function permits a user to have a quick analysis of the health of the wireless devices and their statuses.

In using the extensive scan function, the user may be much more focused on troubleshooting the mesh network in order to understand the behavior of the network over an extended period of time. This may be highly helpful when the site technician senses some undesirable offline behaviors on the network. Currently, there are no available diagnostic tools for the user to understand the behaviors of the wireless network. The extensive scan may present a user with an easy analysis of the network, thereby helping to diagnose the problem.

Figure 22:
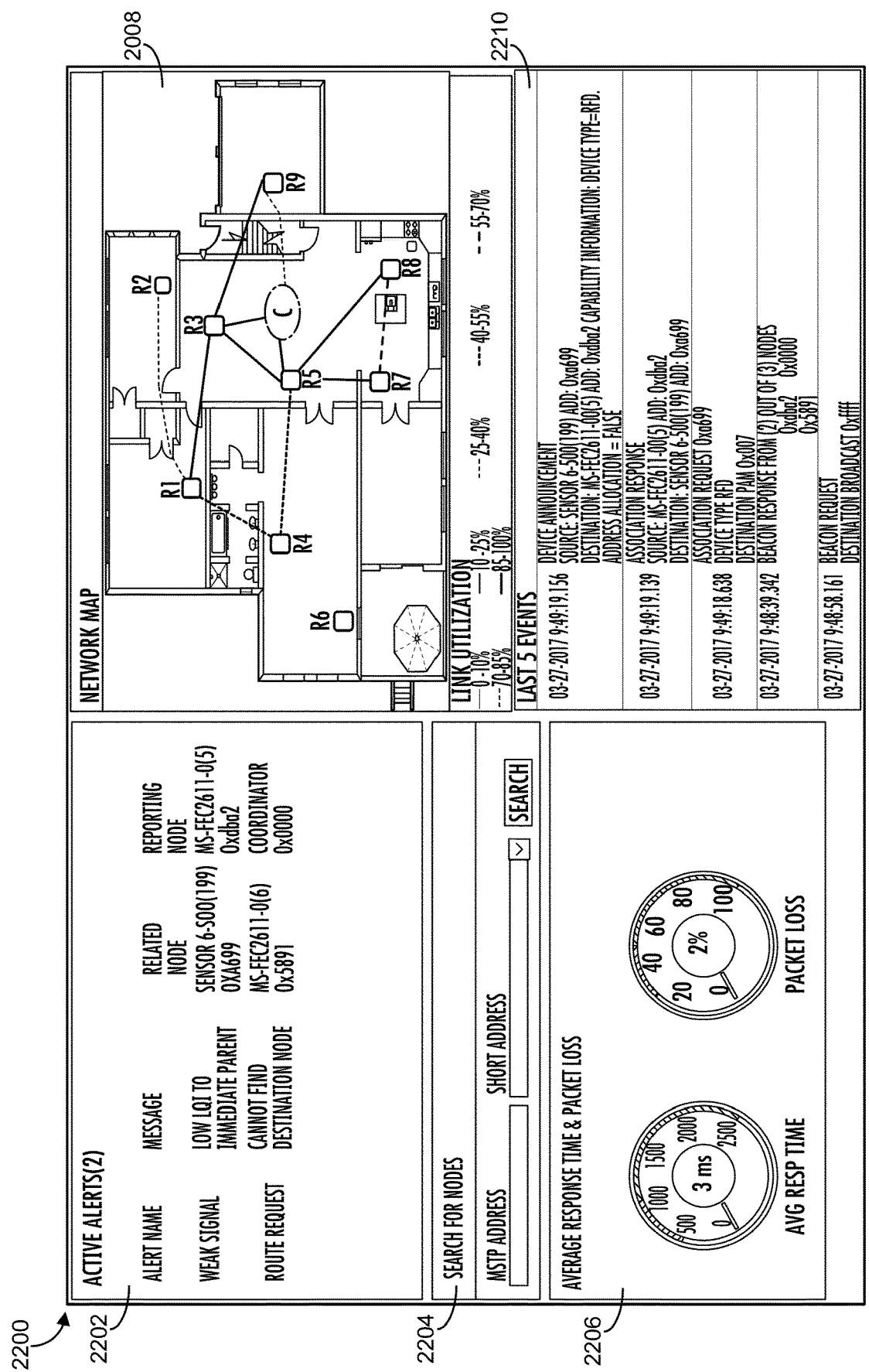
FIG. 22 is a screen shot illustrating a diagnostics interface, according to some embodiments.

Referring now to FIG. 22, a view of the diagnostic screen 2200 is shown, illustrating a behavior of the network. In various embodiments, the diagnostic screen 2200 may include an active alert module 2202, a node search module 2204, an average response time and packet loss module 2206, a network map module 2208, and an event log module 2210. The details of the network are presented to the user in a comprehensible way such that the user can easily understand the behaviors of the network. For example, the active alert module 2202 display possible degradation that the mesh network has or may have in the future. A user may also search for an individual node or device using the node search module 2204 by entering a MAC address or other unique address of the device in order to view individual characteristics in the past time or a current time. The average response time and packet loss module 2206 may display dashboards indicating the current average network response time (e.g., 3 milliseconds) and packet loss (e.g., 2% of the total size of the data packet). The network map module 2208 may include a floorplan map of current link utilizations. The event log module 2210 may detail recent network events (e.g., beacon requests, beacon responses, association requests, association responses, device announcements).

The extensive scan function may also include a functionality to perform multiple sniffs of the network based on a predefined schedule. As the amount of sniffs that may be stored can vary, the extensive scan may be able to schedule the sniffs over a period of time. For example, where the maximum amount of storage would only allow for twenty four hours of storage, the extensive scan may schedule the sniffs for seven days a week for approximately three hours each day.

Figure 23:
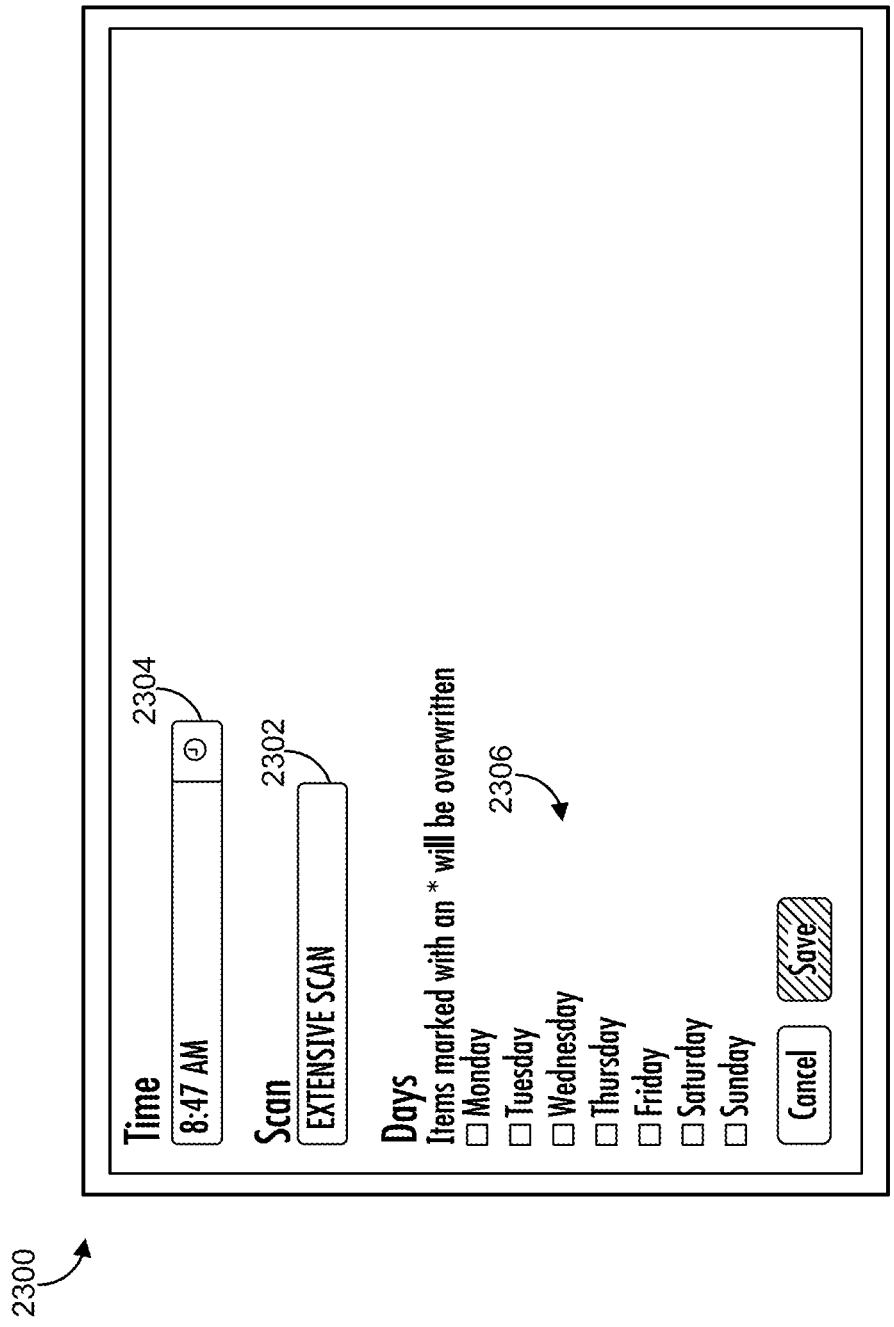
FIG. 23 is a screenshot illustrating a scheduling interface, according to some embodiments.

In some examples, the user may be able to schedule the sniffs using a scheduling interface 2300 as shown in FIG. 23. The scheduling interface 2300 allows a user to schedule an extensive scan using a scan type selection function 2302. The user may then either download the scan results or request a new scan. By allowing for the user to schedule the scans, a user may pre-schedule scans to occur at regular intervals using a scan time selection function 2304 and a scan day selection function 2306.

Wireless Mesh Network Visualization

The wireless mesh network diagnostic tools described above may provide large amounts of data to a user. An application for use with the above tools may be used to graphically display the ZigBee network health. For example, the wireless mesh network diagnostic tool may be a user device (e.g., user device 724, described above with reference to FIG. 7) that includes an application. In one embodiment, the application may be a visualization tool within the processing circuit of the user device 724. In other embodiment, the visualization tool may exist in a network server or other cloud-based service, and can be accessed by a user device via a network connection. In still further embodiments, the visualization tool may be accessed via a UI of a BMS, such as Metasys UI. In some embodiments, a coordinator device of a mesh network may collect and process the data. In other embodiment, a gateway device, or a network access device, such as a MAP gateway device may provide access to the data collected in the wireless mesh network. The user device may then access the data and display the data graphically via a user interface, such as user interface 732, described above.

Figure 24:
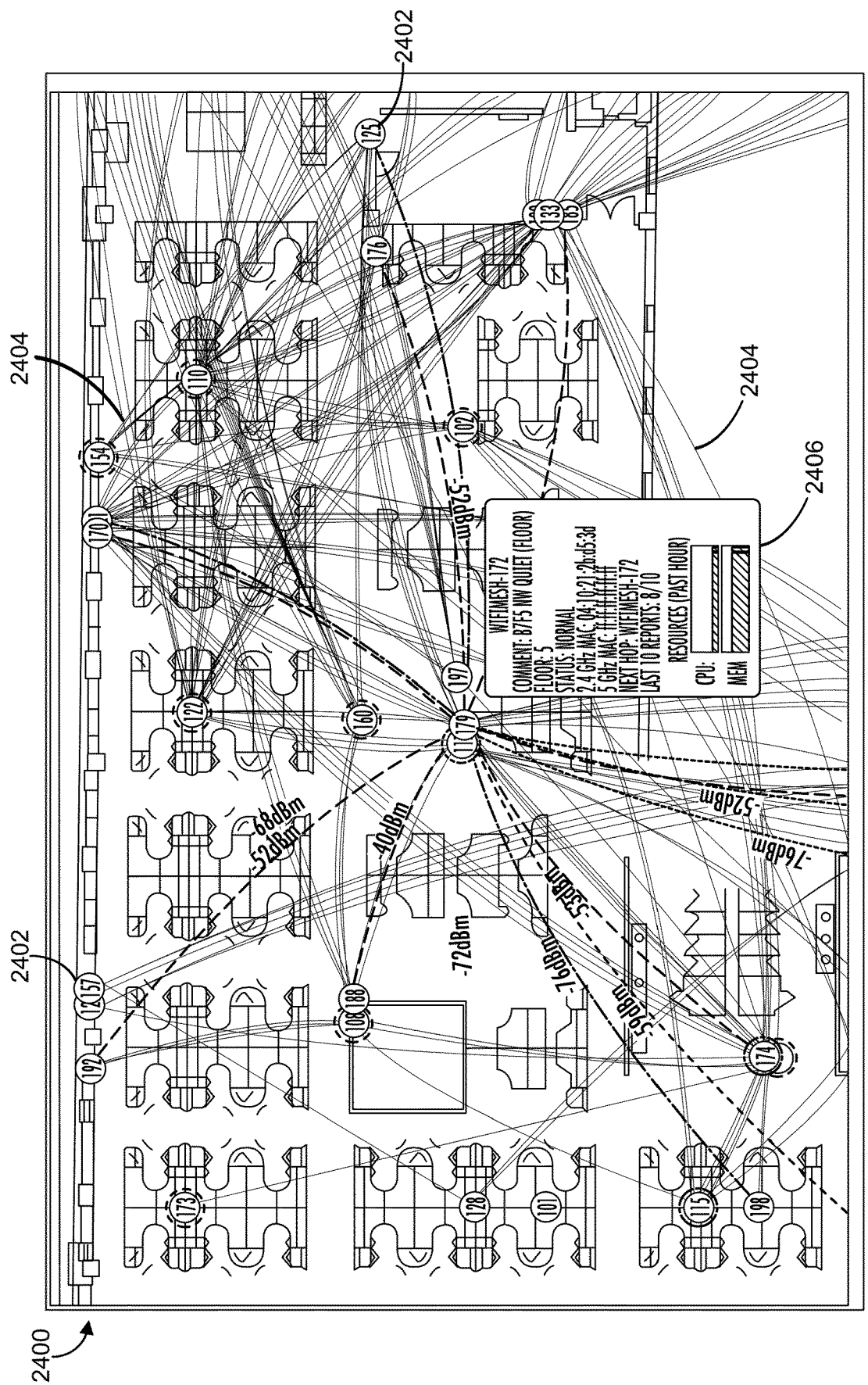
FIG. 24 is a visual representation of a wireless mesh network including diagnostic information, according to some embodiments.

In one embodiment, the data may displayed graphically over a floor plan, such as the scaled floorplans described above. Referring now to FIG. 24, an example visual representation of a wireless mesh network 2400 is shown, according to some embodiments. As described above, diagnostic data may be gathered from one or more devices in the wireless mesh network over time (e.g. via the quick scan or extended scan functions). As also described above, the collected data may be stored. For example, the gateway device and/or the coordinator may store the collected information. In other embodiments, the collected data may be stored in a remote server or database. For example, the gateway device may transmit the data to a remote server or database via the IP network (e.g. a BACnet IP bus).

In one embodiment, the visualization of the wireless mesh network 2400 may be viewed via a web-browser. For example, a user may be able to access the visualization of the wireless mesh network 2400 via a user device with an internet browser. The visualization tool may be configured to access the collected diagnostic data as well as other static data. For example, the visualization tool may access static data such as scaled floorplans and/or the location of wireless mesh network devices. In one embodiment, the scaled floorplans and device locations may be determined as described in FIGS. 7-12, above. For example, the device locations may be determined in part on a survey process that includes technician placement of a transmitter device (e.g., transmitter 702) at multiple test locations. The static data may be used to draw a map, such as the map shown in FIG. 24. On top of the map, one or more color-coded diagnostic indicators may be drawn. For example, the wireless link quality between two devices 2402 in the wireless mesh network may be drawn as an arc 2404 between those devices on the map. Example color coding may include using a red color for a weak signal, a yellow color for an acceptable signal, and green for a strong signal. The wireless link quality may be determined based on the above collected diagnostic data. In some embodiments, collected diagnostic data for a particular device 2402 may be displayed in a device diagnostic module 2406 that appears when a user selects or hovers over the particular device 2402.

Figure 25:
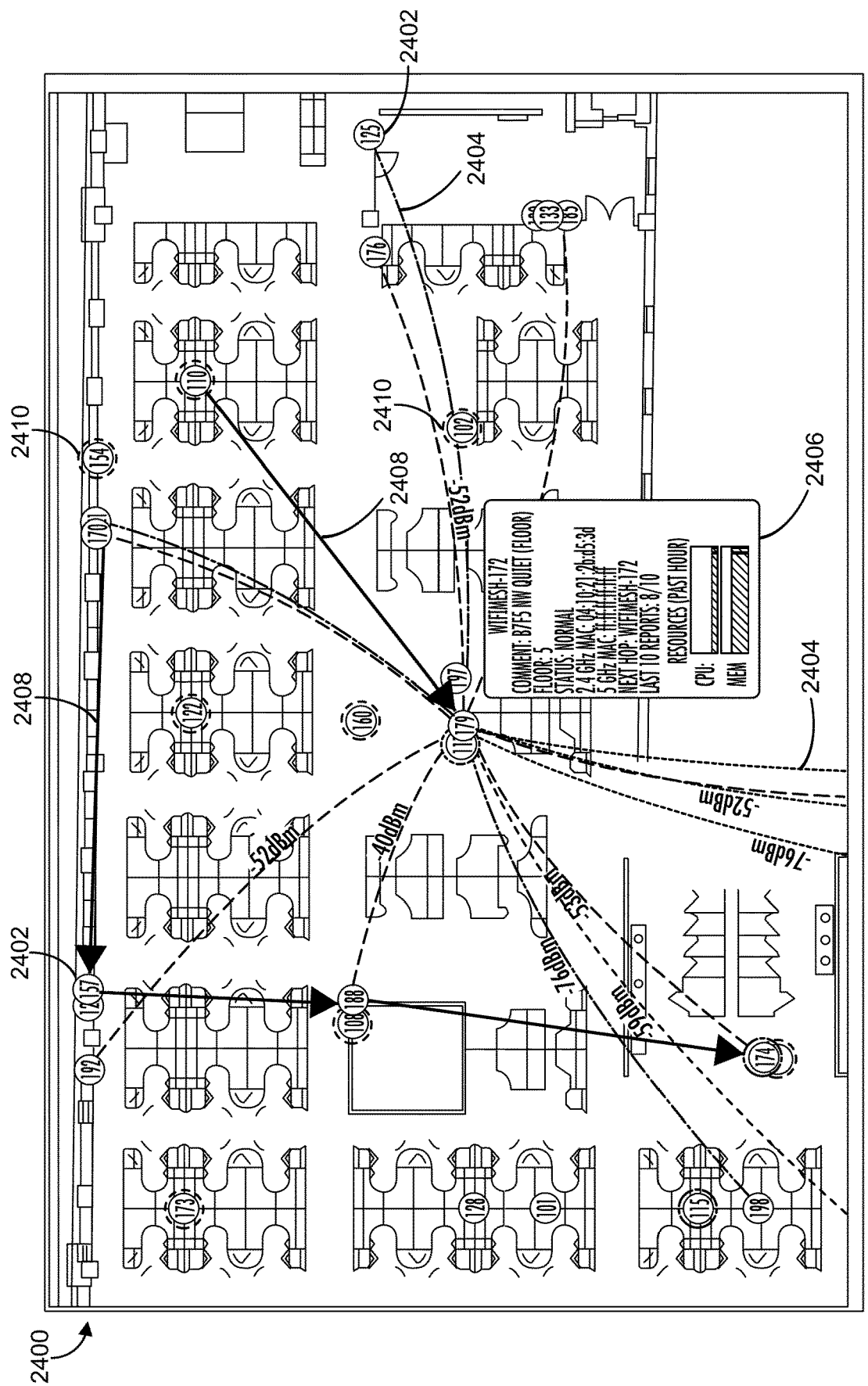
FIG. 25 is another visual representation of a wireless mesh network including diagnostic information, according to some embodiments.

Referring now to FIG. 25, a user may be permitted to select and/or filter the types of diagnostics they wish to view via the visualization of the wireless mesh network 2400. For example, a user may select to show paths toward a primary device (e.g. via straight lines with arrowheads 2408), or device health (e.g. via colored rings 2410 around the devices 2402). Similar to the link quality indicators above, the device health may use color coded rings 2410 around the devices 2402 to indicate device health. Other visualized diagnostics may include, but are not limited to, signal strength (which may be included as labels on arcs 2404), throughput, and memory usage.

Configuration of Exemplary Embodiments

The construction and arrangement of the systems and methods as shown in the various exemplary embodiments are illustrative only. Although only a few embodiments have been described in detail in this disclosure, many modifications are possible (e.g., variations in sizes, dimensions, structures, shapes and proportions of the various elements, values of parameters, mounting arrangements, use of materials, colors, orientations, etc.). For example, the position of elements may be reversed or otherwise varied and the nature or number of discrete elements or positions may be altered or varied. Accordingly, all such modifications are intended to be included within the scope of the present disclosure. The order or sequence of any process or method steps may be varied or re-sequenced according to alternative embodiments. Other substitutions, modifications, changes, and omissions may be made in the design, operating conditions and arrangement of the exemplary embodiments without departing from the scope of the present disclosure.

The present disclosure contemplates methods, systems and program products on any machine-readable media for accomplishing various operations. The embodiments of the present disclosure may be implemented using existing computer processors, or by a special purpose computer processor for an appropriate system, incorporated for this or another purpose, or by a hardwired system. Embodiments within the scope of the present disclosure include program products comprising machine-readable media for carrying or having machine-executable instructions or data structures stored thereon. Such machine-readable media can be any available media that can be accessed by a general purpose or special purpose computer or other machine with a processor. By way of example, such machine-readable media can comprise RAM, ROM, EPROM, EEPROM, CD-ROM or other optical disk storage, magnetic disk storage or other magnetic storage devices, or any other medium which can be used to carry or store desired program code in the form of machine-executable instructions or data structures and which can be accessed by a general purpose or special purpose computer or other machine with a processor. When information is transferred or provided over a network or another communications connection (either hardwired, wireless, or a combination of hardwired or wireless) to a machine, the machine properly views the connection as a machine-readable medium. Thus, any such connection is properly termed a machine-readable medium. Combinations of the above are also included within the scope of machine-readable media. Machine-executable instructions include, for example, instructions and data which cause a general purpose computer, special purpose computer, or special purpose processing machines to perform a certain function or group of functions.

Although the figures show a specific order of method steps, the order of the steps may differ from what is depicted. Also two or more steps may be performed concurrently or with partial concurrence. Such variation will depend on the software and hardware systems chosen and on designer choice. All such variations are within the scope of the disclosure. Likewise, software implementations could be accomplished with standard programming techniques with rule based logic and other logic to accomplish the various connection steps, processing steps, comparison steps and decision steps.

What is claimed is:

1. A wireless mesh network survey tool, comprising:
a user interface; and
a processing circuit comprising a survey module configured to:
access a scaled floorplan of a building site;
identify a receiver device location on the scaled floorplan;
instruct a user to position a transmitter device that is communicably coupled to the receiver device at a plurality of test locations to determine a signal strength at each of the plurality of test locations;
determine a device count for a proposed wireless mesh network based at least in part on the signal strength at each of the plurality of test locations; wherein the device count includes a plurality of repeater devices; and
display the proposed wireless mesh network to the user via the user interface, wherein the proposed wireless mesh network includes recommended locations for the plurality of repeater devices on the scaled floorplan.

2. The wireless mesh network survey tool of claim 1, wherein the processing circuit further comprises a data analysis module configured to generate the recommended locations for the plurality of repeater devices.

3. The wireless mesh network survey tool of claim 2, wherein the recommended locations for the plurality of repeater devices are based on at least one of building materials, ceiling materials, or wall materials.

4. The wireless mesh network survey tool of claim 2, wherein the data analysis module is further configured to generate a technical survey report for the building site, the technical survey report comprising at least one of a heat map or a weak zone.

5. The wireless mesh network survey tool of claim 1, wherein the proposed wireless mesh network is a Zigbee (IEEE 802.15.4) mesh network.

6. The wireless mesh network survey tool of claim 1, wherein the proposed wireless mesh network is a Wi-Fi mesh network.

7. The wireless mesh network survey tool of claim 1, wherein the user interface comprises at least one of a switch, an actuator, a touch screen display, or a keypad.

8. The wireless mesh network survey tool of claim 1, wherein the wireless mesh network survey tool comprises at least one of a laptop computer, a personal computer (PC), a tablet computer, or a mobile device.

9. A method for generating a proposed wireless mesh network for a building, the method comprising:
accessing a scaled floorplan of a building site;
identifying a receiver device location on the scaled floorplan;
instructing a user to position a transmitter device that is communicably coupled to the receiver device at a plurality of test locations to determine a signal strength at each of the plurality of test locations;
determining a device count for a proposed wireless mesh network; wherein the device count includes a plurality of repeater devices; and
displaying the proposed wireless mesh network to the user via a user interface, wherein the proposed wireless mesh network includes recommended locations for the plurality of repeater devices on the scaled floorplan.

10. The method of claim 9, wherein the method further includes generating a technical survey report for the building site, the technical survey report comprising at least one of a heat map or a weak zone.

11. The method of claim 9, wherein the proposed wireless mesh network is a Zigbee (IEEE 802.15.4) mesh network.

12. The method of claim 9, wherein the proposed wireless mesh network is a Wi-Fi mesh network.

13. A wireless mesh network diagnostic tool, comprising:
a user interface; and
a processing circuit comprising a visualization tool configured to:
access static data regarding a building site, wherein the static data is determined at least in part by a network survey process comprising user positioning of a transmitter device at a plurality of test locations;
gather diagnostic data from a plurality of wireless network mesh devices; and
display a diagnostic map to a user via the user interface, wherein the diagnostic map comprises at least one diagnostic indicator configured to display a signal strength between the plurality of wireless network mesh devices.

14. The wireless mesh diagnostic tool of claim 13, wherein the static data comprises a scaled floorplan and locations of the plurality of wireless network mesh devices.

15. The wireless mesh diagnostic tool of claim 13, wherein the diagnostic indicator is a device health indicator comprising a color-coded ring surrounding one of the plurality of wireless network mesh devices.

16. The wireless mesh diagnostic tool of claim 13, wherein the diagnostic indicator is a wireless link quality indicator comprising a color-coded arc connecting a first wireless network mesh device to a second wireless network mesh device.

17. The wireless mesh diagnostic tool of claim 13, wherein the visualization tool is configured to gather diagnostic data from the plurality of wireless network mesh devices using a quick scan function.

18. The wireless mesh diagnostic tool of claim 17, wherein the quick scan function is configured to gather at least one of a device status or a device health from each of the plurality of wireless network mesh devices.

19. The wireless mesh diagnostic tool of claim 13, wherein the visualization tool is configured to gather diagnostic data from the plurality of wireless network mesh devices using an extensive scan function.

20. The wireless mesh diagnostic tool of claim 19, wherein the extensive scan function is configured to gather diagnostic data from the plurality of wireless network mesh devices over a configurable time period.

\* \* \* \* \*